(12) United States Patent
Waldman et al.

(10) Patent No.: US 10,546,968 B2
(45) Date of Patent: Jan. 28, 2020

(54) SOLAR CONCENTRATION SYSTEM USING VOLUME HOLOGRAMS

(71) Applicant: HolFocus, LLC, Concord, MA (US)

(72) Inventors: David A. Waldman, Concord, MA (US); Joby Joseph, New Delhi (IN)

( * ) Notice: Subject to any disclaimer, the term of this patent is extended or adjusted under 35 U.S.C. 154(b) by 119 days.

(21) Appl. No.: 14/186,841

(22) Filed: Feb. 21, 2014

(65) Prior Publication Data
US 2014/0230897 A1 Aug. 21, 2014

Related U.S. Application Data

(60) Provisional application No. 61/767,361, filed on Feb. 21, 2013.

(51) Int. Cl.
*H01L 31/054* (2014.01)
*G03H 1/20* (2006.01)

(52) U.S. Cl.
CPC ......... *H01L 31/0543* (2014.12); *G03H 1/202* (2013.01)

(58) Field of Classification Search
CPC ............. H01L 31/0543; H01L 31/0549; H01L 31/055; G03H 1/0248; Y02E 10/52
USPC .......................... 136/246, 259; 359/12, 6, 15
See application file for complete search history.

(56) References Cited

U.S. PATENT DOCUMENTS

| 5,877,874 | A | 3/1999 | Rosenberg |
| 6,274,860 | B1 | 8/2001 | Rosenberg |
| 2001/0008144 | A1* | 7/2001 | Uematsu ............... F24J 2/06 136/246 |
| 2009/0199900 | A1* | 8/2009 | Bita .................. H01L 31/0543 136/259 |
| 2009/0255569 | A1* | 10/2009 | Sampsell ........ H01L 31/022425 136/246 |
| 2010/0186818 | A1* | 7/2010 | Okorogu ........... H01L 31/0547 136/259 |

OTHER PUBLICATIONS

"Advanced Photovoltaic Modules," Prism Solar Technologies, Inc. www.nrel.gov/technologytransfer/pdfs/igf20_prism.pdf (Oct. 2007).

* cited by examiner

*Primary Examiner* — Allison Bourke
*Assistant Examiner* — Dujuan A Horton
(74) *Attorney, Agent, or Firm* — Kenneth J. Lukacher Law Group; Kenneth J. LuKacher

(57) ABSTRACT

An electromagnetic wave concentrating system, comprising a photovoltaic material and at least one holographic concentrator. The holographic concentrator includes at least two stacked holographic optical elements (HOE). Each HOE is configured to diffract incident light into a diffracted beams having different ranges of wavelengths. The diffracted beams generated by each HOE are directed at the photovoltaic material.

19 Claims, 16 Drawing Sheets

Example Cross-section View for Horizontal and Vertical Positions of Volume Holograms and Photovoltaic Cell

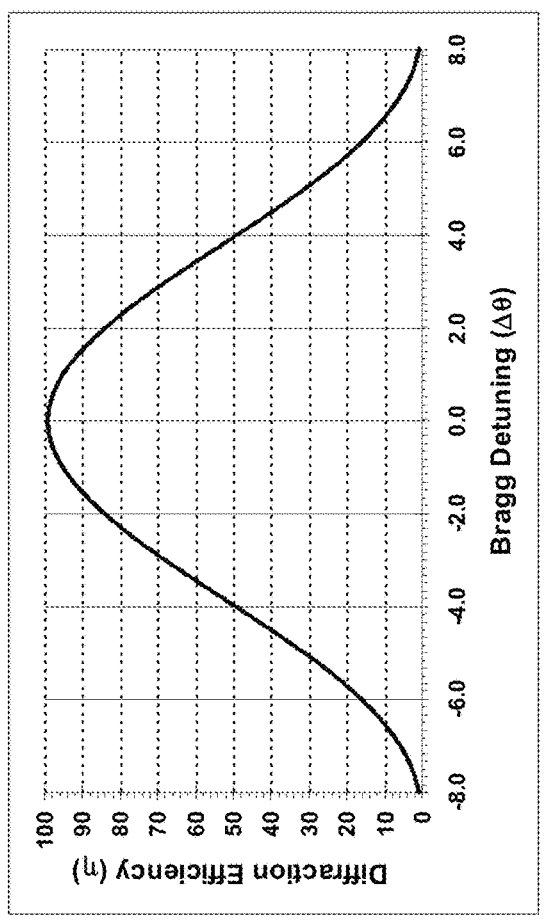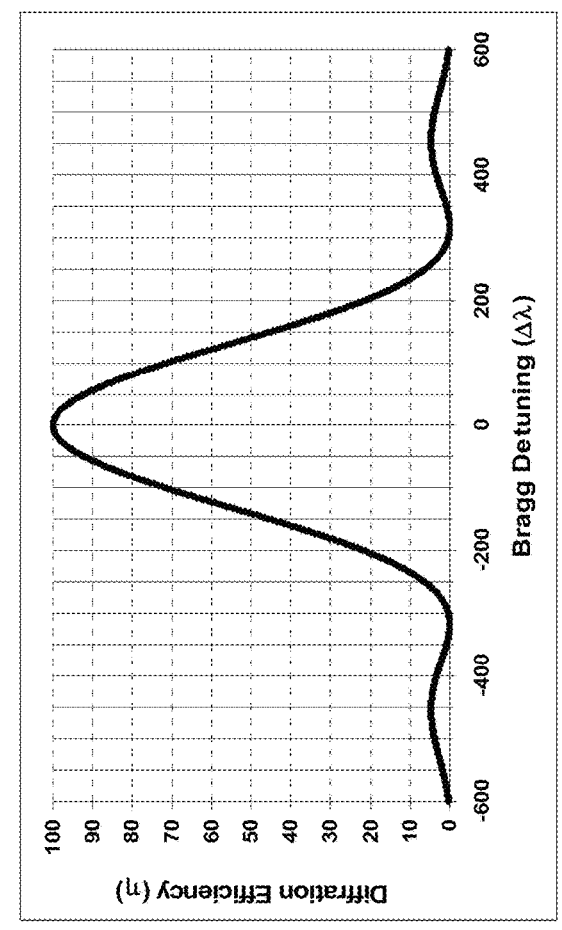

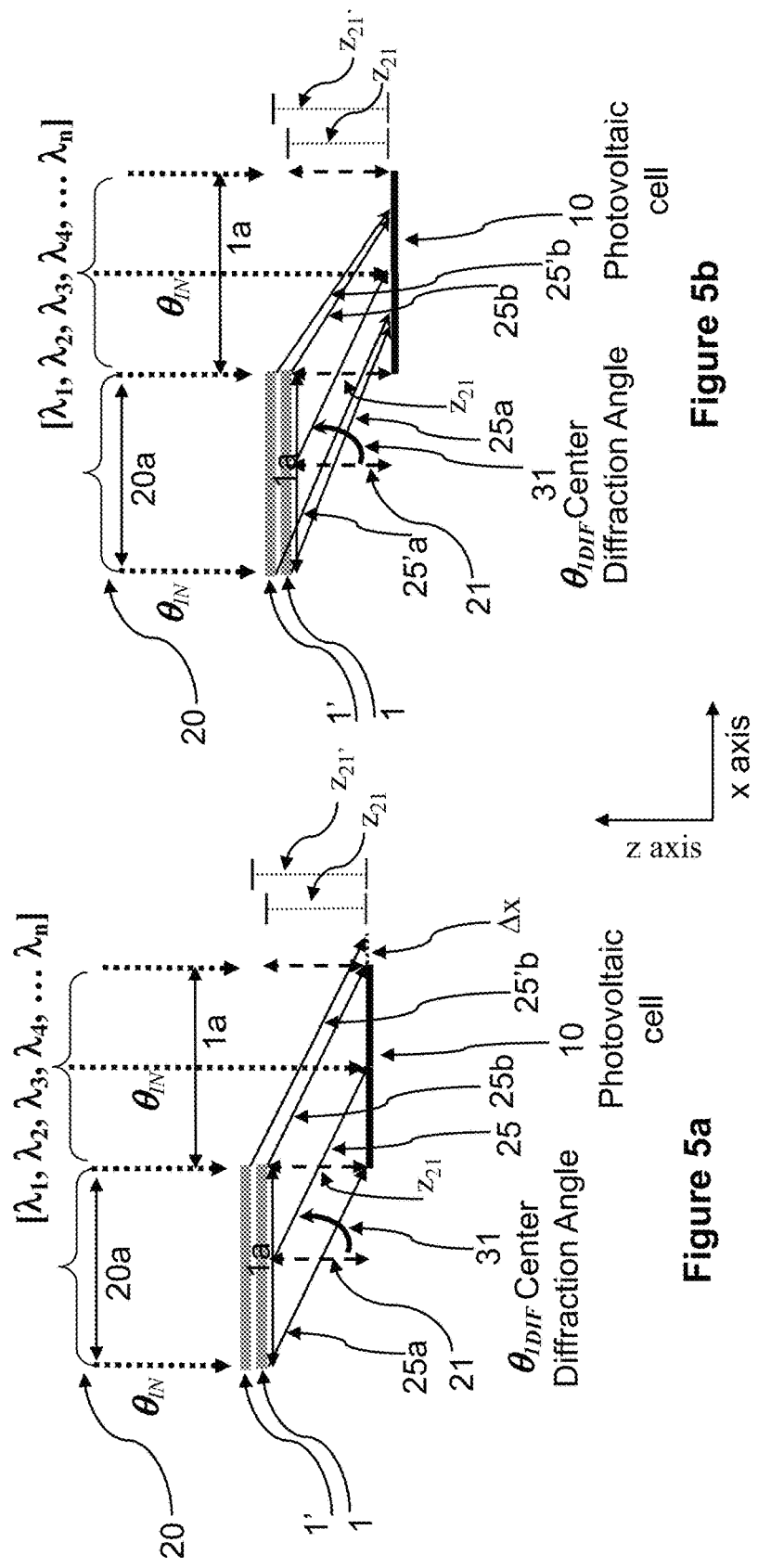

Composite Hologram

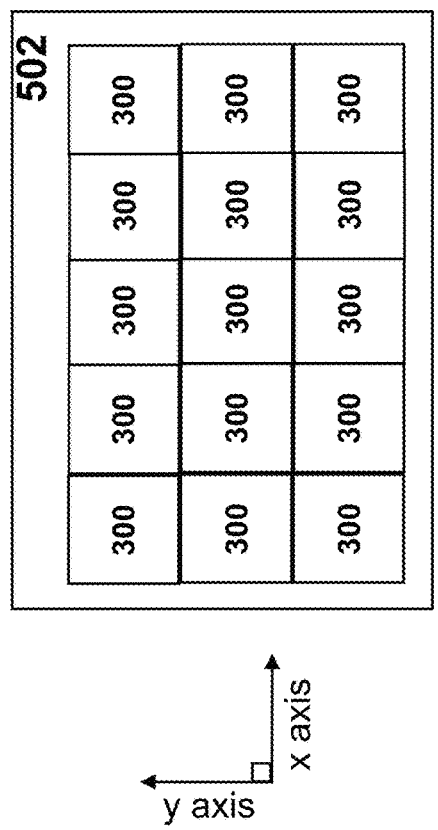
Figure 13a
Figure 13b
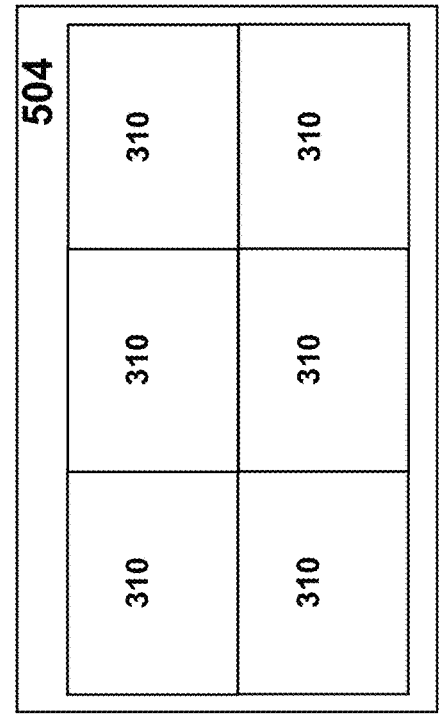
Figure 13c
Figure 13d

SOLAR CONCENTRATION SYSTEM USING VOLUME HOLOGRAMS

RELATED APPLICATION

This application claims the benefit of U.S. Provisional Application No. 61/767,361, filed on Feb. 21, 2013. The entire teachings of the above application are incorporated herein by reference.

BACKGROUND OF THE INVENTION

Efficiently harvesting incident light is of utmost importance in the field of solar energy. The conventional method of light concentration, however, requires accurate alignment or tracking systems to maintain proper orientation of the optical axis of the lens or mirror(s) optical elements with respect to the illumination angle of the incident direct sunlight. The larger the effective concentration ratio the more critical the angle alignment. The need exists for a method and an apparatus capable of high degree of light concentration while maintaining high degree of alignment with the Sun.

SUMMARY OF THE INVENTION

In an example embodiment, the present invention is an electromagnetic wave concentrating system, comprising a photovoltaic material and at least a first holographic concentrator. The at least first holographic concentrator comprises a first holographic optical element (HOE) configured to diffract incident light into a first diffracted beam having a first range of wavelengths, and at least a second HOE configured to diffract incident light into a second diffracted beam having a second range of wavelengths, different from the first range of wavelength, the first and the second diffracted beams directed to the photovoltaic material. The first diffracted beam is at least partially incident on and transmitted by the at least second HOE.

In another example embodiment, the present invention is an apparatus for recording contact copy transmission holograms. The apparatus comprises a laser configured to generate a coherent beam; a beam expander configured to expand the coherent beam and to generate an expanded beam; a first cylindrical lens having a first axis, configured to focus the expanded beam into a focused beam; a second cylindrical lens having a second axis, perpendicular to the first axis, the second cylindrical lens configured to shape the focused beam into a rectangular beam; a movable mirror; a master media; and a copy media in optical contact with the master media. The movable mirror is configured to rotate about an axis and to direct the rectangular beam along a first direction on a surface of the master media; the copy media is configured to move along a second direction, perpendicular to the first direction; the master media is configured to partially diffract the rectangular beam incident on its surface into a diffracted beam, and to partially transmit the rectangular beam incident on its surface into a transmitted beam, coherent with the diffracted beam, the diffracted beam and the transmitted beam each are incident on the copy media and forming an interference pattern in the copy media.

In another example embodiment, the present invention is an apparatus for recording contact copy transmission holograms. The apparatus comprises a laser configured to generate a coherent beam; a beam expander configured to expand the coherent beam and to generate an expanded beam; a first cylindrical lens having a first axis, configured to focus the expanded beam into a focused beam; a second cylindrical lens having a second axis, perpendicular to the first axis, the second cylindrical lens configured to shape the focused beam into a rectangular beam; a first movable mirror; a second movable mirror; a master media; and a copy media in optical contact with the master media. The first movable mirror is configured to rotate about an axis and to direct the rectangular beam along a first direction on a surface of the second movable mirror; the second movable mirror is configured to reflect the rectangular beam incident on the second movable mirror to the master media, the second movable mirror is further configured to move along a second direction, perpendicular to the first direction; the master media is configured to partially diffract the rectangular beam incident on its surface into a diffracted beam, and to partially transmit the rectangular beam incident on its surface into a transmitted beam, coherent with the diffracted beam, the diffracted beam and the transmitted beam each are incident on the copy media and forming an interference pattern in the copy media.

In another example embodiment, the present invention is an electromagnetic wave concentrating system. The system comprises a wedge substrate having an edge; a photovoltaic material disposed at the wedge substrate edge; and at least a first holographic concentrator. The at least first holographic concentrator comprises a first holographic optical element (HOE), and at least a second HOE, configured to diffract incident light into a first diffracted beam having a first range of wavelengths and at least a second diffracted beam, having a second range of wavelengths, different from the first range of wavelength. The first diffracted beam is at least partially incident on and transmitted by the at least second HOE. The at least first holographic concentrator is configured to direct the first and the at least second diffracted beams into the wedge substrate, forming a first and a second refracted beams, the wedge substrate is configured to direct the first and the second refracted beams by total internal reflection to the photovoltaic material.

BRIEF DESCRIPTION OF THE DRAWINGS

FIGS. 3a and 3b each is an example plot of angular Bragg selectivity for a slant fringe hologram that can be employed by the devices and methods disclosed herein.

FIGS. 5a and 5b each is a schematic diagram of example embodiment of the present invention.

FIGS. 13a, 13b, 13c, and 13d each is a schematic diagram of example embodiment of the present invention.

Figure 1:
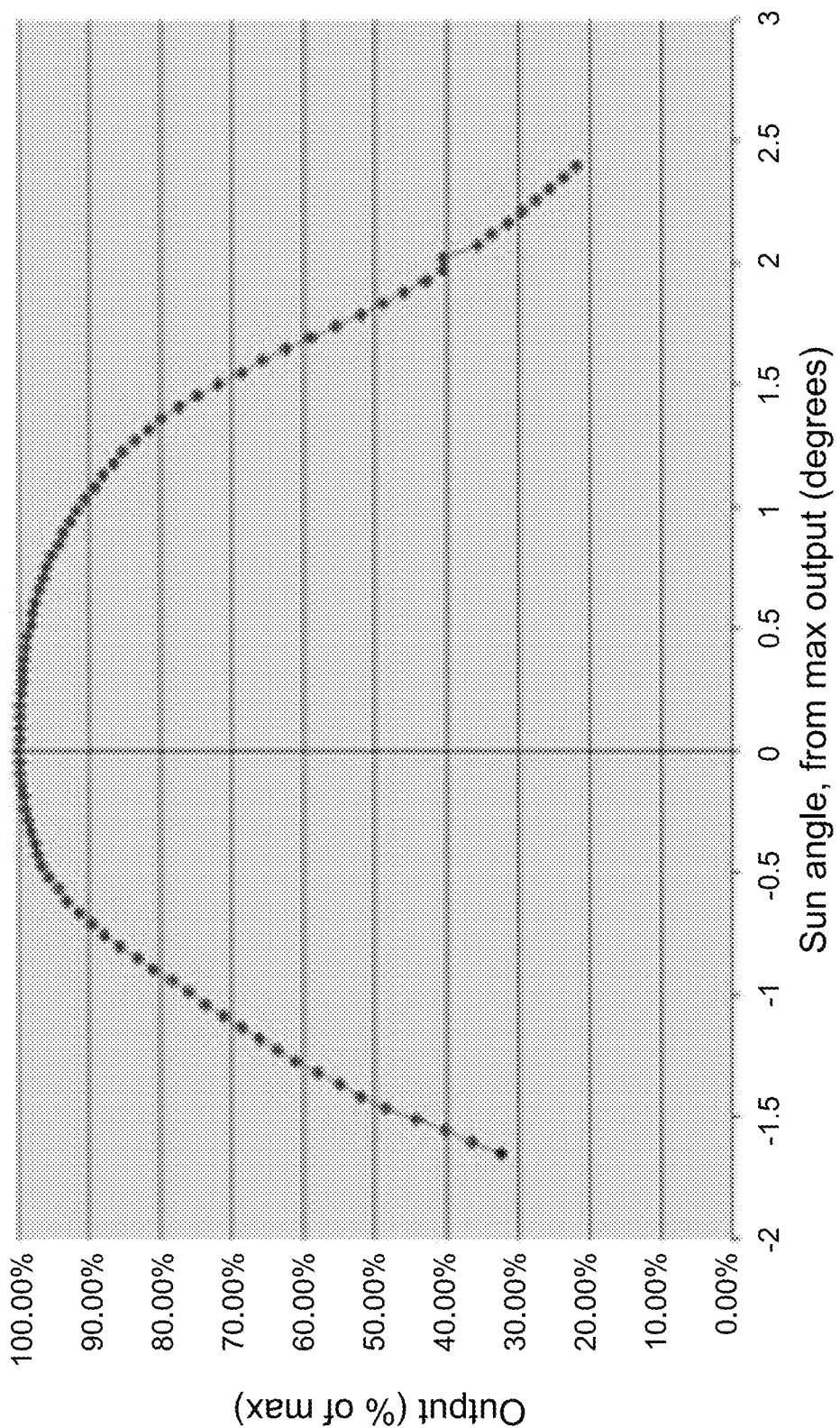
FIG. 1 is a plot of the output efficiency of a photovoltaic material as a function of the angle of incident light.

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

Concentrator systems for solar modules generally comprise refractive lens or mirrors that collect and focus light incident from the sun onto a photovoltaic material to achieve a factor of about 50 to 1000 times reduction between the area of collection of the incident sunlight and the area of the photovoltaic material where the focused sunlight is aimed. Such concentration systems can reduce the cost of solar modules by substantially reducing the area of the most expensive component in the solar module, namely the photovoltaic material. The photovoltaic cells in a solar module can make up about 70 to 80% or more of the total manufacturing cost of a typical solar module. The conventional method of light concentration, however, requires accurate alignment or tracking systems to maintain proper orientation of the optical axis of the lens or mirror(s) optical elements with respect to the illumination angle of the incident direct sunlight. The larger the effective concentration ratio the more critical the angle alignment, thus tracking systems designed for greater than about 50 suns concentration require dual axis alignment to adjust for change in incident angle of the sunlight during the daytime hours and during seasonal changes. The resulting angle alignment must achieve and maintain better than about 0.5 degree accuracy so as to provide suitably accurate aiming of the focused directed sunlight onto the small area of the photovoltaic cell. When the angle of the direct sunlight is misaligned by only about 1 to 2 degrees (see FIG. 1) then the focused sunlight illuminates only a portion of the photovoltaic cell, thereby causing substantial decline in the intensity of the sunlight that is incident to the cell and correspondingly a significant decline in the output power of the solar module. Systems that can ameliorate these stringent alignment requirements, such as providing for relatively course alignment with respect to the daytime and/or seasonal changes in incident angle of sunlight or no alignment requirements for seasonal changes in the incident angle of sunlight, can provide significant advantages in realized average output power produced by solar modules. Similarly, when the sunlight is not direct sun, but rather is from a white or grey sky due to the presence of clouds, smog, precipitation, etc., then the aforementioned concentration systems fail to properly focus the sunlight onto the solar cell, resulting in substantial decline in output efficiency of the solar module even by comparison to modules having no concentrator optics.

Other concentration systems have been disclosed which utilize compact planar waveguide methods comprising diffractive optical elements (i.e. holograms). These systems, however, can only achieve low concentration ratios of about 2 to 3 suns in order to remain compact in the thickness dimension, and achieved ratios have fallen short of the projected values. Further, they require solid substrates that must have thickness similar to the width dimension of the photovoltaic cell (see FIG. 2) which adds to their cost and reduces their practicality. The holographic planar waveguide is, however, desirably more passive for its optical alignment with respect to the angle of illumination of the direct sunlight provided the thickness of the hologram is on the order of about 5 to 20 microns. The less stringent alignment requirement is related to the angular Bragg selectivity characteristics of the thin holographic element. An example of angular Bragg selectivity for a slant fringe hologram having thickness of 10 microns recorded with Object and Reference beams at 0 and 45 degrees, respectively, is shown in FIG. 3. The hologram can provide improved angular bandwidth for the incident angles of illumination compared for example to use of a Fresnel lens with high numerical aperture. For example, as shown in FIG. 3, the Full Width Half Maximum (FWHM) is about 8°, based upon calculated Bragg selectivity using coupled wave analysis method for a 10 micron thick hologram. The systems using holographic planar waveguide methods, however, cannot provide adequately high concentration ratios to be effective for use with standard size polycrystalline or monocrystalline photovoltaic cell materials without adding cost and weight of thick substrate blocks of glass or transparent polymers to the module. Additionally, the holographic planar waveguide method still requires alignment, but with coarser increments, due to dependence of diffraction efficiency output from the hologram on the incident angle of the sunlight. The holographic planar waveguide concentration method generally requires groupings of spatially multiplexed holograms (see Rosenberg in U.S. Pat. Nos. 5,877,874 and 6,274,860), each to collect incident sunlight from a portion of the entire visible spectrum or from a range of incident angles, that confine or trap the incident sunlight within a substrate by Total Internal Reflection (TIR) so as to waveguide the grouping of wavelengths in the visible spectrum to be incident on the solar cell. The holographic planar waveguide of Rosenberg uses holograms that diffract a range of the incident visible wavelengths to a certain angle, and diffracts another range of the incident visible wavelengths to a different angle. Waveguiding of the incident sunlight, thereby efficiently confining it within a substrate, is achieved by holograms diffracting ranges of visible wavelengths of the sunlight, each range at respective angles that each equal or exceed the critical angle, $\theta_c$, for TIR at an interface, shown in FIG. 2 and Eqn. 1 as $$\theta_c = \arcsin(n_2/n_1) \qquad \text{Eqn. 1}$$

where $n_1$ and $n_2$ are the refractive indices of the denser and rarer mediums, respectively, for sunlight entering a rarer medium from a denser medium, and where the denser medium is a substrate block having thickness similar to the width of the solar cell.

Figure 2:
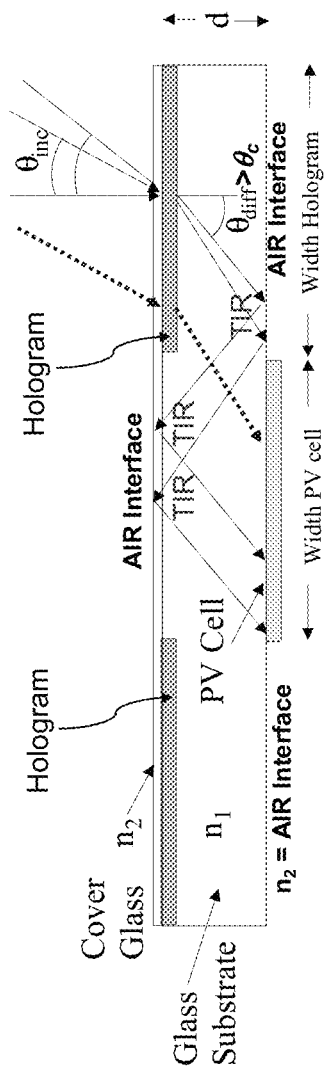
FIG. 2 is a solar concentrating device of prior art.

Although the diffracted light is efficiently redirected by TIR conditions along the length of the substrate, the intensity of the diffracted light is critically dependent on the amount of detuning of the incident angle of the sunlight with respect the design reconstruction angle of the recorded hologram (see FIG. 3). Further, as shown in FIG. 2, the achievable concentration ratio is limited due to the parallel planar arrangement of the solar cell and the holograms and the requirement that the diffracted light must be either (i) directly incident upon the solar cell, or (ii) reflected by TIR from the bottom substrate/air interface and thereby directed to the substrate/air at the top in order for TIR conditions to redirect the diffracted light to the solar cell.

The Electromagnetic Wave Concentrating System of the Present Invention

The term "photovoltaic material," as used herein, refers to a material that generates voltage and current across two points in that material when the light is incident upon it.

The term "holographic optical element" (HOE), as used herein refers to a hologram that consists of a diffraction pattern rendered as a surface relief or as a thin film containing an index modulation throughout the thickness of the film. HOEs can be reflection HOE or transmission HOE.

As used herein, the term "center angle," when referring to a diffracted beam, means the angle at which a ray having wavelength of approximately 2 within an incident beam having wavelength range of $\lambda \pm \Delta\lambda$ is diffracted from the center line of the HOE.

As used herein, the term "about," when referring to an angle, means a margin of approximately 1°. For example, "about 45°" means 45±1°.

As used herein, the phrase "about parallel," when referring to planes, means that the angle between planes is not greater than ±10°.

"Rectangular beam" is a beam having a rectangular cross-section, also referred to herein as a "bar."

The term "disposed at," when referring to a wedge substrate and an HOE, means that the HOE may be mounted on the surface of the wedge substrate or may be separated by a gap from the surface of the wedge substrate.

The terms "electromagnetic wave concentrating system" and "holographic concentrator system" are used interchangeably through this disclosure.

The holographic concentrator system of the present invention comprises one or more transmission volume holograms having thickness in the range of 3 to 20 microns, optionally multiplexed holograms, that are disposed in at least one grouping of at least two layers overlapping the same area, wherein each said volume hologram in a first layer re-directs a range of wavelengths of the light incident from the sun to the hologram(s) in the at least second layer such that the direction of the diffracted sunlight exiting from the at least two layers of said holograms overlapping the same area is aimed to be incident onto a photovoltaic material (i.e. photovoltaic cell) so as to be at least partially spatially superimposed on the surface of the said photovoltaic cell, and, more preferably, incident onto said photovoltaic material so as to be substantially spatially superimposed onto the surface the photovoltaic cell. The transmission holograms of the present invention are disposed in at least one grouping comprising holograms in at least two layers, wherein the layers of a grouping can be oriented so as to be optionally coplanar, and, further, can be oriented in a plane that is substantially parallel to the plane containing the photovoltaic cell(s), or, optionally, the said holograms can be oriented in a plane that is tilted with respect to the plane of the photovoltaic cell(s) or, alternatively, the said holograms can be oriented so as to be substantially perpendicular to the photovoltaic cell(s) such as for a waveguide implementation where the surface of the photovoltaic cell(s) can be parallel to a side wall of the waveguide substrate and the holograms are disposed along the top or bottom face of the waveguide substrate.

Figure 4:
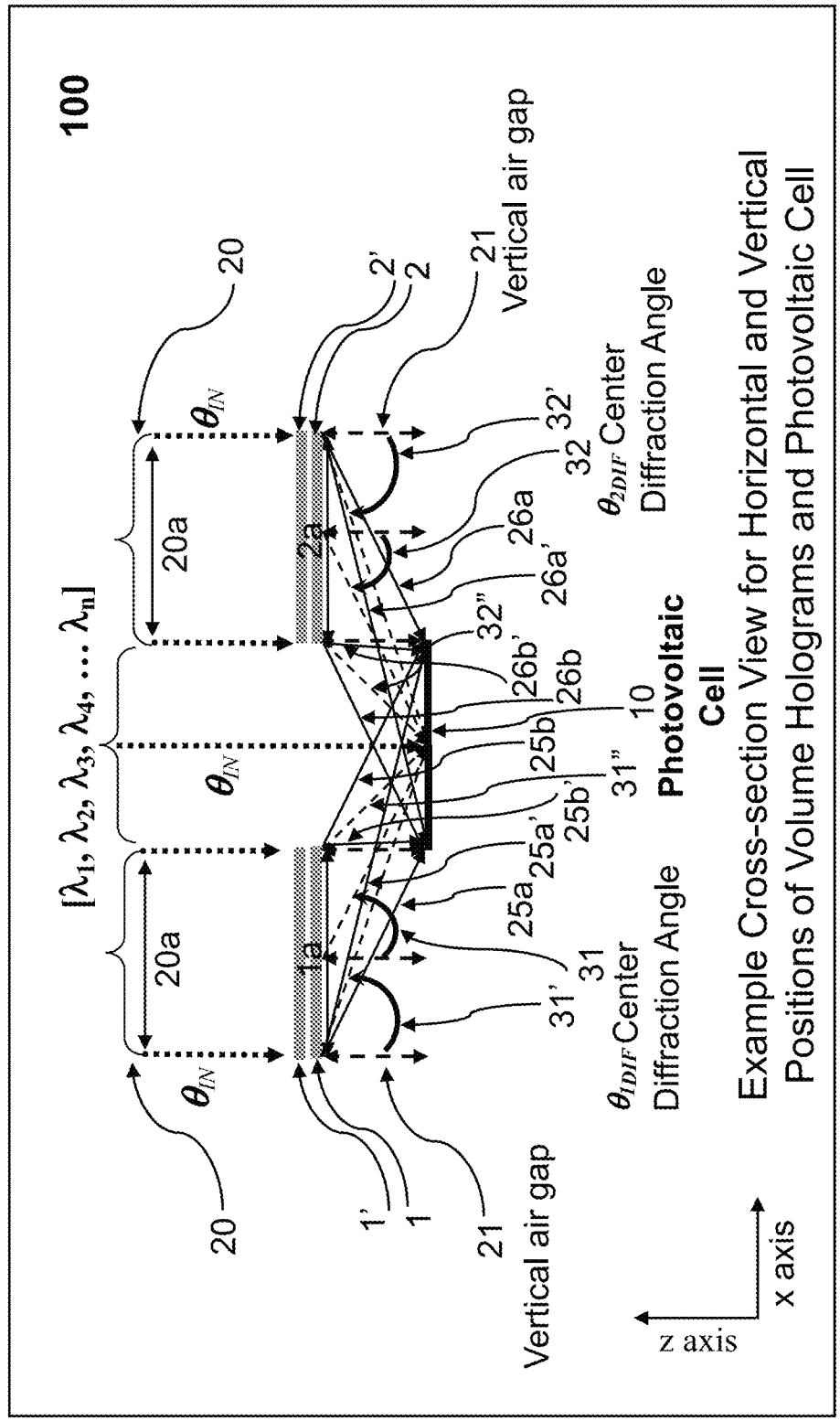
FIG. 4 is a schematic diagram of an example embodiment of the present invention.

For example, in FIG. 4 is shown schematically a cross-section view of the width dimension of, by way of example, two groupings of holograms, each comprising two layers of volume transmission holograms, optionally each multiplexed, a first said hologram grouping 1 and 1' and a second said hologram grouping 2 and 2'. In each hologram grouping, the layers of volume transmission holograms are shown, by way of example, to be positioned in substantially parallel planes and the layers are overlapping the same area, wherein a grouping(s) is disposed to be positioned vertically above a photovoltaic cell 10 and, additionally, laterally spaced with respect to the lateral position of a photovoltaic cell 10 so as to be positioned both above and to either side of the photovoltaic cell 10 in a solar concentrator system 100. The range of wavelengths, $\lambda_1, \lambda_2, \lambda_3, \lambda_4, \ldots, \lambda_n$, of the incident sunlight 20 can be groupings of wavelengths in the visible spectrum, such as between about 400 nm and 700 nm so as to preferably generate the color components of white light that can be diffracted and thereby redirected and aimed to the photovoltaic cell, and, additionally, can further include groupings of wavelengths in the near infrared spectrum such as between about 700 nm and 1100 nm that similarly can be diffracted and thereby redirected and aimed to the photovoltaic cell. Optionally, at least a portion of the said at least partially spatially superimposed diffracted sunlight incident onto a photovoltaic cell(s) can satisfy the coordinates of the CIE chromaticity plot, depending on the distance between the said holograms and photovoltaic cell(s), to yield white light by the additive color theory.

In one embodiment of the present invention, depicted schematically in FIG. 4, the groupings or layers of transmission volume holograms, optionally multiplexed, 1 and 1' or 2 and 2', and the photovoltaic cell(s) 10 are preferably positioned with respect to each other so as to be in substantially parallel planes in the solar concentrator system 100. The sunlight 20 is shown schematically to be incident on the groupings of planar transmission volume holograms that are each disposed in respective parallel planes and overlapping the same area, optionally multiplexed, 1 and 1' and 2 and 2', at a common angle $\theta_{IN}$ representing the angle of the substantially collimated sunlight incident on a photovoltaic cell(s) or a solar module comprising a grouping of photovoltaic cells. The direction of the diffracted light, such as bounded by rays 25a and 25a' and rays 25b and 25b' for holograms 1 and 1' in a first grouping, or rays 26a and 26a' and rays 26b and 26b' for holograms 2 and 2' in a second grouping, said rays depicted as solid arrows, that exits from the respective said groupings of planar volume holograms, where within each grouping the holograms are each preferably disposed in parallel planes and are overlapping the same area, can be incident together or collectively on the photovoltaic cell 10. The center exit angle of the diffracted light from the said groupings of planar volume holograms, 1 and 1' and 2 and 2', is depicted schematically as dashed arrows labeled as rays 31' and 31 or 32' and 32, respectively, for the diffracted light that, for example, exits from the outermost edge and from the center of the said volume holograms in each said grouping. Similarly, there can be a center exit angle 31" and 32" from said groupings of planar volume holograms, 1 and 1' and 2 and 2', that each exit from the innermost edge of the said respective holograms. The center exit angles of the diffracted light from the groupings of said volume holograms, 1 and 1' and 2 and 2', where within each grouping the holograms are preferably disposed in parallel planes and are overlapping the same area, will be referred to generally in the foregoing descriptions of the present invention as $\theta_{1_{DIF}}$ and $\theta_{2_{DIF}}$, respectively.

The center exit diffraction angles, $\theta_{1_{DIF}}$ and $\theta_{2_{DIF}}$, are depicted to have nominally a common value but are of opposite direction for their center aiming angle exiting from the center of the said volume holograms with respect to the perpendicular to the photovoltaic cell 10 independent of the center diffracted wavelength in the range of wavelengths diffracted by each said volume hologram(s), wherein $\theta_{1_{DIF}}$ is nominally the same angle size as $\theta_{2_{DIF}}$, for example shown schematically as rays 31 and 32, respectively, incident on photovoltaic cell 10. There is angular dispersion for the wavelength bandwidth of the incident sunlight, $\Delta\lambda$, that is reconstructed by any of the said example planar volume holograms in the said grouping or layers of example transmission volume holograms, therefore the rays 25a and 25a' or 25b and 25b' for hologram layers 1 and 1', or rays 26a and 26a' or 26b and 26b' for hologram layers 2 and 2', are depicted to represent the range of angles for $\theta_{1_{DIF}}$ and $\theta_{2_{DIF}}$, referred to as $\Delta\theta_{1_{DIF}}$ and $\Delta\theta_{2_{DIF}}$ respectively, for the said angular dispersion of the diffracted light in the wavelength bandwidth from the incident sunlight that exits the outer and inner edges of said volume holograms and is thereby aimed to be incident on the said photovoltaic cell 10. The range of angles that exits the lateral center of said volume holograms and is incident on the said photovoltaic cell will be a larger range of angles than the range of angles that exits the outer edge of the said volume hologram and is incident on the said photovoltaic cell, and will be a smaller range of angles than the range of angles that exits the inner edge of the said volume hologram and is incident on the said photovoltaic cell. By way of example, when the lateral dimension of the said volume holograms, 1 and 1' or 2 and 2', shown in FIG. 4 is the same as the lateral dimension of the said photovoltaic cell 10, and, additionally, is the same as the vertical separation distance 21 between a said volume hologram and said photovoltaic cell 10, then the range of angles $\Delta\theta_{1_{DIF}}$ and $\Delta\theta_{2_{DIF}}$ will be about 18.4° (i.e. 45° to 63.4)°, 29.7° (i.e. 26.6° to 56.3°) and 45° (i.e. 0° to 45°), for the angular dispersion of the diffracted light in the wavelength bandwidth that exits the outer edge, center and inner edge, respectively, of the said volume holograms and is incident on the said photovoltaic cell 10. For the same example case, the center angles of the angular dispersion that exits the said volume holograms, 1 and 1' in a first grouping or 2 and 2' in a second grouping, with respect to the perpendicular to the surface of the said photovoltaic cell 10, are about 56.3°, 45.0° and 26.6° from the outermost edge, center and innermost edges, respectively, of the said volume holograms, and are generally referred to herein as $\theta_{1_{DIF}}$ for hologram layers 1 and correspond to the center wavelength in the reconstruction wavelength bandwidth of the diffracted light that is aimed to be incident on the photovoltaic cell 10. The aimed angular dispersion, $\Delta\theta_{1_{DIF}}$ and $\Delta\theta_{2_{DIF}}$, corresponding to the wavelength bandwidth reconstructed by the said planar volume hologram(s) that is aimed by the holograms to be incident on the photovoltaic cell 10 is preferably less than about +/−30 degrees and more preferably less than about +/−22.5 degrees. Again, the angles $\theta_{1_{DIF}}$ and $\theta_{2_{DIF}}$ in FIG. 4 are depicted schematically for simplicity as single fixed angles shown as dashed arrows, wherein they correspond to values of the center diffraction angle from the outermost edge or center or innermost edge of the said volume holograms with respect to the perpendicular to the photovoltaic cell 10 for the center wavelength of the diffracted light in the wavelength bandwidth that exits said volume holograms and is incident on the photovoltaic cell 10.

In an alternative embodiment, the above described center diffraction angles $\theta_{1_{DIF}}$ and $\theta_{2_{DIF}}$ are not the same for all of the volume holograms in the stack of layers of said volume holograms in a grouping, but are adjusted to provide for maximum overlap of the diffracted color bands of the incident sunlight that are redirected by the respective volume holograms in the stack of layers so as to be optimally combined at the surface of the photovoltaic cell 10. By way of example, light diffracted by the topmost volume holograms 1' or 2' in their respective stack of layers of volume holograms will travel a slightly longer distance to the plane of the photovoltaic cell 10 than light diffracted by holograms 1 or 2 located further below in their respective stack, namely a vertical distance along the z-direction of $z_{21}'$ versus $z_{21}$ as shown in FIG. 5. If the photovoltaic cell 10 has the same lateral dimension in x-direction, depicted as 1a, as holograms 1' and 1, and $\theta_{1'_{DIF}} = \theta_{1_{DIF}}$, then the increased increment in vertical distance along the z-direction, $z_{21'} - z_{21}$, causes the diffracted light exiting from hologram 1' in the stack to be translated along the x-direction with respect to light exiting from hologram 1. Thus, if the diffracted light 25b from hologram 1 arrives at photovoltaic cell 10 such that the diffracted light from the left and right edges of hologram 1 is coincident with the position along the x-direction of the left and right edges of photovoltaic cell 10, then diffracted light 25'b of hologram 1' will arrive at the plane containing photovoltaic cell 10 being translated by a distance $\Delta x$ with respect to the left and right edges of photovoltaic cell 10, thereby preventing full spatial overlap of the diffracted light on the photovoltaic cell 10. The diffraction angle of the topmost hologram 1' can be designed to be suitably smaller than for each of the holograms below it in the stack of layers of holograms such that the $\tan\theta_{1'_{DIF}}/\tan\theta_{1_{DIF}}$ is substantially the same as the ratio $z_{21}/z_{21'}$ of the respective vertical distances along the z-direction for diffracted light incident on photovoltaic cell 10 from, for example, holograms 1 and 1'. By way of example, for $$\tan\theta_{1'_{DIF}}/\tan\theta_{1_{DIF}} = z_{21}/z_{21'}. \qquad \text{Eqn. 2}$$

for values of 1a=6", $\theta_{1_{DIF}}$=45.00°, $z_{21}$=6", and $z_{21}'$=6.20", then $\theta_{1'_{DIF}}$=44.06° for overlap of diffracted light from holograms 1' and 1 at photovoltaic cell 10.

Still further, the example transmission volume hologram(s) in the solar concentrator system of the present invention can each comprise a grouping of abutting smaller volume holograms, for example a 6" by 6" hologram can be made from a grouping of nine 2" by 2" holograms arranged in a 3 by 3 grid. The center diffraction angle $\theta_{1_{DIF}}$, previously described as the center of the angular dispersion for the diffracted wavelength bandwidth exiting from the lateral center of the 6" by 6" hologram and incident on photovoltaic cell 10, can instead be, by way of example, but without limitation, the center diffraction angle for the diffracted wavelength bandwidth that exits from each of the three 2" by 2" holograms located in the center column of the 3 by 3 grid. In this representative example case, but without limitation, when the diffracted light exiting said transmission volume holograms in the 3 by 3 grid is aimed to a photovoltaic cell positioned laterally to their right, then the 2" by 2" holograms located in the left column of the 3 by 3 grid can have their center diffraction angle be larger than $\theta_{1_{DIF}}$ and the 2" by 2" holograms located in the right column of the 3 by 3 grid can have their center diffraction angle be smaller than $\theta_{1_{DIF}}$, such that the grouping of holograms in the right, center and left columns, respectively, collectively aim the center angles of the said angular dispersion of their respective diffracted light towards the lateral center of the corresponding photovoltaic cell. If the photovoltaic cell is disposed laterally to the left of the said example composite 6" by 6" volume hologram comprising a grouping of nine smaller abutting 2" by 2" holograms arranged in a 3 by 3 grid, then the 2" by 2" holograms located in the left column of the 3 by 3 grid can have their said center diffraction angle be smaller than $\theta_{1_{DIF}}$ and the 2" by 2" holograms located in the right column of the 3 by 3 grid can have their said center diffraction angle be larger than $\theta_{1_{DIF}}$ such that the grouping of holograms in the right, center and left columns, respectively, aim the center angles of the said angular dispersion of their respective diffracted light collectively towards the lateral center of the corresponding photovoltaic cell.

Figure 6B:
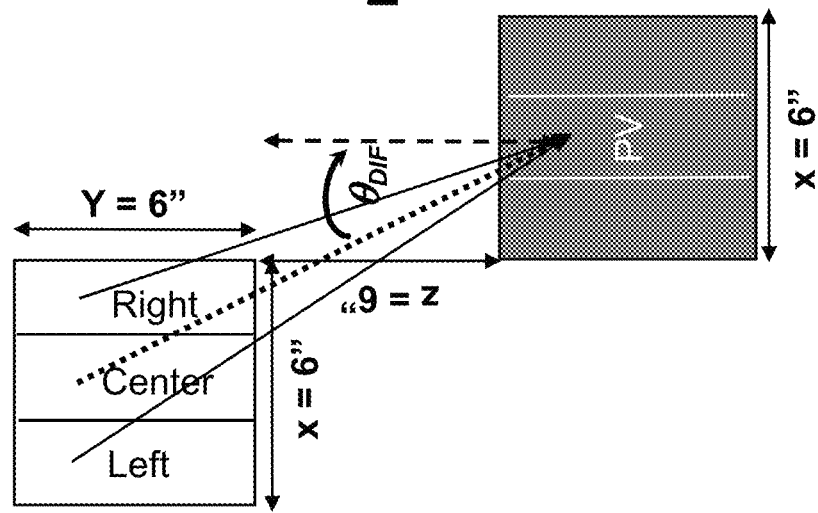
FIGS. 6a and 6b each is a schematic diagram of example embodiment of the present invention.
Figure 6A:
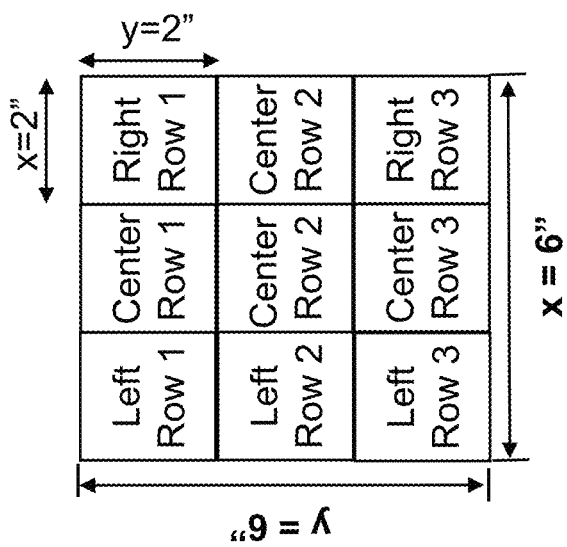

FIG. 6a schematically depicts an arrangement of nine 2" by 2" holograms arranged in a 3 by 3 grid of left, center and right columns each with Rows 1, 2 and 3, together representing an example of a 6" by 6" composite volume hologram comprising a tiled arrangement of abutting smaller size volume holograms. Such an arrangement of tiled abutting volume holograms can be advantageous for recording uniform high diffraction efficiency over a large area volume hologram such as a 6" by 6" volume hologram, due to practical limitations in available laser power and sizes of readily available optics suitable for use for recording volume holograms. FIG. 6b schematically depicts three different center diffraction angles for the angular dispersion of the diffracted light exiting from the center of the left, center and right columns of the example composite volume hologram that, by way of example, is aimed to be incident together on the center column (i.e. lateral center) of the photovoltaic cell, said photovoltaic cell having the same length and width dimensions as the example 6" by 6" composite volume hologram. By way of example, if the said center diffraction angle of the diffracted light exiting from the holograms in the center column of the 6" by 6" composite volume hologram is 45° with respect to the perpendicular to the photovoltaic cell, such as when the vertical separation distance between the 6" by 6" composite volume hologram and the photovoltaic cell is 6", then the said center diffraction angle of the angular dispersion of the diffracted light exiting from the center of the holograms in the left and right columns of the composite volume hologram in FIG. 6b is about 53 and 34 degrees, respectively. In alternative embodiments of the present invention, the photovoltaic cell can have larger or smaller length and/or width dimensions than the composite volume hologram and the composite holograms can have larger or smaller length and/or width dimensions than depicted in FIG. 6a. FIG. 6b schematically depicts that the separation height distance between the plane of the said composite volume hologram and the plane of the surface of the photovoltaic cell is the same as the length and width dimensions of the said composite hologram, which for the example case depicted is 6". In alternative embodiments of the present invention, the separation height distance between the composite volume hologram and the photovoltaic cell may be less than or greater than the length or width dimensions of the composite volume hologram.

According to Kogelnik's coupled wave theory for volume holograms, the expression for diffraction efficiency, η, for thick phase transmission holograms considered to be lossless dielectric gratings, which takes into consideration the deviation from the recording Bragg angle or wavelength in the hologram reconstruction, is given by $$\eta = \sin^2(v^2 + \xi^2)^{0.5} / (1 + \xi^2/v^2) \qquad \text{Eqn. 3}$$

where $$v = \frac{\pi n_1 d}{\lambda} \cos\theta_o \qquad \text{Eqn. 4}$$

and $$\xi = \Delta\theta \cdot K d_h \sin(\phi - \theta_o)/(2c_s) - \Delta\lambda \cdot K^2 d_h/(8\pi n c_s) \qquad \text{Eqn. 5}$$

where v is the grating strength, and the parameter ξ is related to the first order dephasing measure by the ratio $d_h/2c_s$, where the grating vector K=2π/Λ; Λ is the grating period; $c_s$=sin $\theta_s$ with $\theta_s$ the recording object beam angle; $d_h$ the thickness of the hologram; φ is the angle that the grating vector makes with the z-axis that is oriented perpendicular to the surface of the hologram, typically referred to as the slant angle; $\theta_o$ is the reconstruction Bragg angle; Δθ is the deviation angle from the Bragg reconstruction angle, and n is the average refractive index of the hologram. The angular and wavelength selectivity characteristics for volume holograms are defined as the full width half maximum of the respective detuning curves, and can be expressed for unslanted holograms from coupled wave analysis as $$2\Delta\theta_{1/2} \approx \Lambda/d \qquad \text{Eqn. 6}$$

and $$2\Delta\lambda_{1/2}/\lambda \approx \cot\theta(\Lambda/d), \qquad \text{Eqn. 7}$$

wherein Λ is the grating period, d is the thickness of the volume hologram, Δθ is the detuning angle from the Bragg angle $\theta_o$, Δλ is the detuning wavelength from the Bragg wavelength $\lambda_o$, and θ is the angle of recording light.

Figure 7:
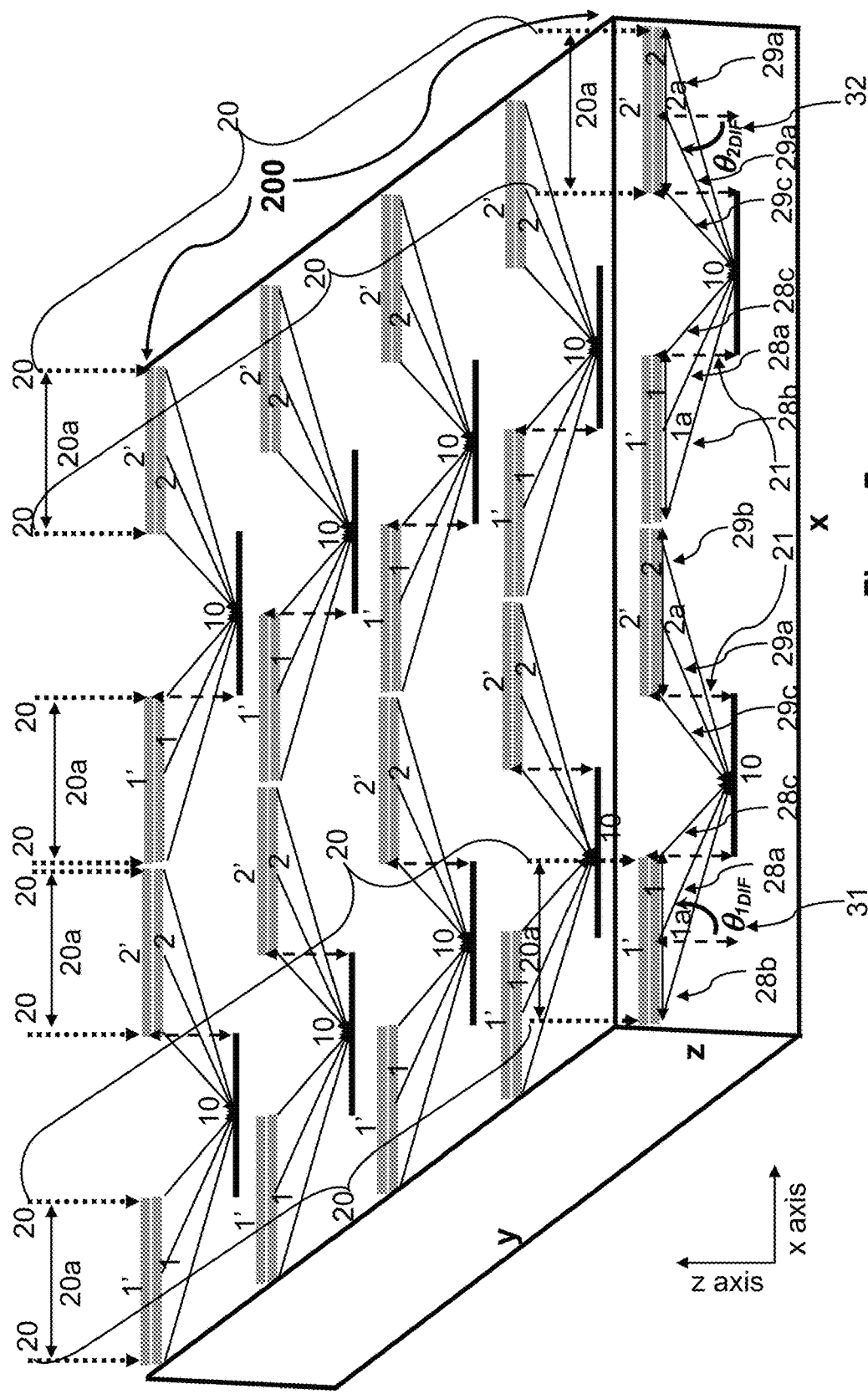
FIG. 7 is a schematic diagram of an example embodiment of the present invention.

Groupings of holographic solar concentrator systems 100 of the present invention can be arranged as subsystems in a solar module 200 of the present invention, that, by way of example, and as depicted schematically in cross-section view in FIG. 7, comprises a grouping of photovoltaic cells 10 and corresponding groupings or layers of volume holograms, 1 and 1' and 2 and 2', optionally multiplexed, that each direct or aim a wavelength bandwidth of the incident sunlight to the photovoltaic cells 10. By way of example, the grouping of photovoltaic cells can be disposed in one layer and the groupings of volume holograms can be disposed in another layer or stack of layers, and the said photovoltaic cell and hologram layers can be disposed to be parallel to each other as depicted schematically, or inclined with respect to each other or, alternatively, in another embodiment they can be disposed to be perpendicular to each other. The direction of the diffracted light exiting from the edges and the center of the lateral (x-axis) dimension of the said volume hologram(s) shown in FIG. 7 for solar module 200, such as along rays 28a, 28b and 28c, or rays 29a, 29b and 29c, correspond to the aforementioned center diffraction angles $\theta_{1_{DIF}}$ and $\theta_{2_{DIF}}$ previously described as the center of the angular dispersion for the diffracted wavelength bandwidth Δλ that exits from the edges and center of said groupings of volume holograms in the concentrator subsystems 100 making up solar module 200 so as to be incident on said grouping of photovoltaic cells 10. These said center diffraction angles preferably can be a grouping of common incident angles onto the grouping of photovoltaic cells 10 in the said module 200 with respect to the perpendicular to the said photovoltaic cells for the center wavelength $\lambda_o$ of the reconstructed wavelength bandwidth Δλ of the diffracted light 28 and 29 that exits the said groupings of volume holograms of each concentrator subsystem 100 in solar module 200 so as to be incident onto said photovoltaic cells. As previously described, the common diffraction angles can be adjusted for said different layers of holograms in a grouping, such as 1 and 1' or 2 and 2', to compensate for differences in vertical distances along the z-direction for diffracted light incident on photovoltaic cells 10 from said different layers of holograms in a grouping, so as to provide for optimal overlap of the diffracted light 28 and 29 that is redirected and aimed to the photovoltaic cells 10. For schematic simplicity, FIG. 7 shows an example solar module 200 in cross-section view for groupings or layers of volume holograms 1 and 1' and 2 and 2', optionally multiplexed, and photovoltaic cells 10, such that only the width dimension along the x-direction of the said volume holograms and photovoltaic cells 10 is depicted and their length dimension along the y-direction of module 200 is not shown. Typically, the dimensions of the width and length of polycrystalline Si or monocrystalline Si or multi junction photovoltaic cells are the same, such as 6" by 6" or 5" by 5" or 1 cm×1 cm, respectively, whereas the thin film technology is generally narrower along its width dimension and can be longer along its length dimension. The said photovoltaic cells 10 are shown in FIG. 7 to be positioned in a layer at a height position disposed below the corresponding grouping or layers of volume holograms 1 and 1' and 2 and 2', optionally multiplexed, wherein the said volume holograms are depicted, by way of example, as transmission holograms. Although FIGS. 4, 5 and 7 schematically depict 2 layers of volume holograms in a grouping disposed laterally to the left and right of a photovoltaic cell 10, this example is not limiting and more than 2 layers of volume holograms can be used in each grouping of holograms. For example, 3 or more layers of volume holograms can be disposed in parallel layers in a grouping, such as to provide for diffracting a broader range of wavelengths incident from the sunlight and thereby direct a broader range of wavelengths to the photovoltaic cells 10.

Alternatively, the said volume holograms and the photovoltaic cell(s) in holographic concentrator system 100 or solar module 200 can be positioned to have a wedge angle between the plane of the planar holograms and the plane of the top surface of the photovoltaic cell(s), or, alternatively, the output diffracted light exiting the said holograms can be optically coupled into an additional substrate that redirects the diffracted light to the photovoltaic cells that are instead disposed along a wall of the substrate in the vertical direction. The holographic concentrator system 100 in the solar module 200 can comprise one or more transmission volume holograms as shown, in which case the holograms in the groupings are disposed collectively in a layer that can be a panel disposed at a selected height position above the photovoltaic cell(s) 10, as depicted, or can comprise one or more reflection volume holograms, in which case the groupings of holograms can be disposed in a layer that can be a panel disposed at a selected height position below the photovoltaic cell(s) 10, and, further, the photovoltaic cells can optionally be bifacial. When the grouping(s) of holograms are reflection volume holograms then the holograms in a grouping can be similarly disposed in layers that each are optionally oriented to be parallel and overlapping the same area, wherein each said volume reflection hologram in the at least second layer re-directs a range of wavelengths of the light incident from the sun to the hologram(s) in the first layer such that the direction of the diffracted sunlight exiting from the at least two layers of said holograms overlapping the same area is aimed to be incident to a photovoltaic cell 10 so as to be at least partially spatially superimposed on the surface of the said photovoltaic cell, and, more preferably, incident so as to be substantially spatially superimposed onto the surface the photovoltaic cell 10. When the photovoltaic cell(s) 10 is optionally bifacial, then sunlight can be incident directly to the top face of the photovoltaic cell(s) 10, and, additionally, can be incident to the said reflection volume holograms in a grouping and thereby diffracted by the said reflection volume holograms to be directed to the opposite face of the photovoltaic cells(s) 10. The photovoltaic cell 10 material, by way of example, may be selected from polycrystalline Si, monocrystalline Si, thick Si film, two junction or multi junction materials, single junction GaAs single crystal or thin film, various thin film technologies such as CdTe, $Cu(In,Ga)Se_2$, amorphous Si, organic dye sensitized photovoltaic materials which optionally may be coated on flexible base materials, and the like. The volume holograms can be volume phase transmission or volume phase reflection holograms.

In one embodiment, the holographic concentrator system 100 or solar module 200 of the present invention comprises volume holograms that may additionally be stacked so as to be disposed in one or more layers, said layers oriented preferably in parallel planes, wherein the stacked holograms in a grouping can operate independently such that diffracted light form any one hologram in a stack of the volume holograms in grouping is substantially transmitted by the other volume holograms in the stack. Further, the stacked layers can be oriented to be parallel to the top surface of the photovoltaic cell 10, or alternatively they can be oriented to have a wedge angle with respect to the top surface of the said photovoltaic cell 10 or oriented with use of an additional substrate such as a waveguiding substrate to be perpendicular to the cell 10. The grouping or stack of planar layers of volume holograms oriented in parallel planes, each comprising at least one volume hologram, optionally multiplexed, can be separated by substrates used for each hologram media within a said stack and can preferably be overlapping in area, or the volume holograms in the said stack of layers can be positioned directly above or below another hologram in the stack. The said layers of volume holograms in a stack may be laminated or otherwise connected or positioned, such as by use of optically or thermally cured adhesive or pressure sensitive adhesive, to preferably form a monolithic planar layered structure wherein the vertically adjacent said layers of volume holograms in a grouping in the said stack are preferably in optical contact. The adhesive or laminate material can be selected to preferably have a value of refractive index that is substantially the same as the average refractive index of the hologram(s) and/or the refractive index of the substrate of the hologram(s) so as to reduce Fresnel type reflection losses at the interfaces in the said stack of planar layers of holograms. Further, the top layer of the volume holograms in each grouping or a top substrate material of the volume holograms may optionally have an antireflection coating to reduce top surface reflection losses for the incident sunlight.

The diffracted sunlight from one said hologram layer, such as shown in FIG. 4 to be bounded by rays 25a and 25a' or rays 26a and 26a' from the outer edge of said volume holograms, and 25b and 25b' or 26b and 26b' from the inner edge of said volume holograms, that may optionally comprise multiplexed holograms, can be transmitted through the one or more other said hologram layers in a grouping or stack so as to preferably maintain the aiming angle direction of the diffracted light exiting a said hologram layer onto the photovoltaic cell(s) 10. Optionally, the aiming angle direction of the said diffracted light from a hologram layer can be adjusted as described above (see FIG. 5) to compensate for holograms in the said layered stack having different distances along the vertical z-direction from the photovoltaic cell(s) 10 so as to provide for more optimal overlap of the said diffracted light that is transmitted through the other said hologram layers in a stack and thereby aimed to be incident to the photovoltaic cell(s) 10. For example, regarding the diffraction angle exiting the edge of the said hologram layers, in FIG. 8 the diffracted light 25" that exits from the edge of hologram layer 1", that is at angle $\theta_{1A_{DIF}}$ degrees with respect to the perpendicular to hologram layer 1" and comprises light of wavelength range $\lambda_1$ to $\lambda_2$, can transmit through hologram layer 1' such that the light which exits from hologram layer 1' (see arrow (→) in FIG. 8 on left side of hologram layer 1" depicting direction of diffracted light 25" of wavelength range $\lambda_1$ to $\lambda_2$ exiting hologram layer 1" and transmitting through layer 1') comprises the said diffracted light 25" of wavelength range $\lambda_1$ to $\lambda_2$ from hologram layer 1" at the said angle $\theta_{1A_{DIF}}$ degrees. Further, the diffracted light 25' that exits from the edge of hologram layer 1', due to diffraction from one or more volume holograms in hologram layer 1', can be at substantially the same angle $\theta_{1A_{DIF}}$ degrees with respect to the perpendicular to hologram layer 1' and can comprise light of a different wavelength range $\lambda_3$ to $\lambda_4$ (see arrow (→) in FIG. 8 on left side of hologram layer 1' depicting direction of diffracted light 25' of wavelength range $\lambda_3$ to $\lambda_4$ exiting hologram layer 1'), and, further, can preferably transmit through other layers in the said stack such as through depicted layer 1. The wavelength range $\lambda_1$ to $\lambda_2$ and $\lambda_3$ to $\lambda_4$ can be overlapping in at least some wavelengths, or be separated in wavelength, or the two ranges of wavelengths can be abutting in wavelength, and preferably the wavelength ranges are in the visible and/or near infrared spectrum between about 400 nm and 1100 nm, and more preferably between about 450 nm and 1100 nm. Similarly, the said diffracted light 25" that exits from the edge of hologram layer 1" (exit angle $\theta_{1A_{DIF}}$ degrees, wavelength range $\lambda_1$ to $\lambda_2$) can optionally transmit through hologram layer 1' and optionally at least one other hologram layer 1 such that the light which exits from the at least one other hologram layer 1 comprises said diffracted light 25" from hologram layer 1" at said angle $\lambda_{1A_{DIF}}$ degrees. Further, the said diffracted light 25' from hologram layer 1' (exit angle $\theta_{1A_{DIF}}$ degrees, wavelength range $\lambda_3$ to $\lambda_4$) can optionally transmit through the at least one other hologram layer 1 (see arrow (→) in FIG. 8 on left side of hologram layer 1' depicting direction of diffracted light 25' of wavelength range $\lambda_3$ to $\lambda_4$ exiting hologram layer 1' and transmitting through layer 1) such that the light which exits from the at least one other hologram layer 1 comprises said diffracted light 25' from hologram layer 1' at said exit angle $\theta_{1A_{DIF}}$ degrees. Further, the said common center diffraction angle $\theta_{1A_{DIF}}$ that exits from the edges and/or lateral centers of the at least two layers, such as shown in FIGS. 4, 5 and 7, can exhibit angular dispersion $\Delta\theta_{1_{DIF}}$ that is preferably less than about +/−30 degrees and more preferably less than about +/−22.5 degrees with respect to the perpendicular to the said photovoltaic cell(s) 10 due to the aforementioned reconstructed wavelength bandwidth that said volume holograms aim to be incident on the photovoltaic cell(s) 10.

Figure 8:
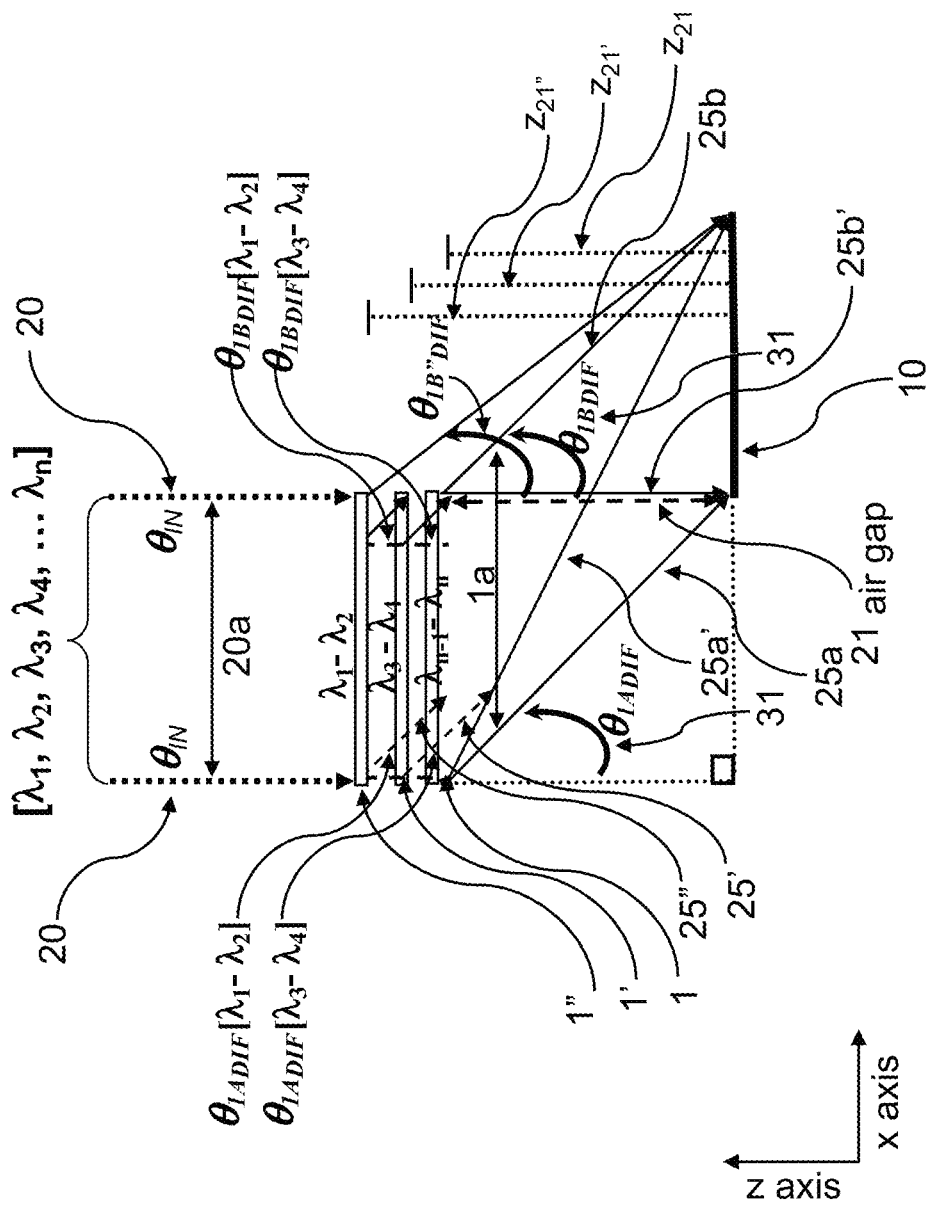
FIG. 8 is a schematic diagram of an example embodiment of the present invention.

The diffracted light 25 for the design reconstruction wavelength bandwidth that exits said example volume hologram layers 1", 1' and 1' from the outer edges of the hologram layers so as to be incident on photovoltaic cell(s) 10 in FIG. 8 is depicted to be bound by rays 25$a$ and 25$a$' or 25$b$ and 25$b$'. Optionally, the common diffraction exit angles, such as $\theta_{1A_{DIF}}$ and $\theta_{1B_{DIF}}$ for diffraction from the edges of the said hologram layers or $\theta_{1_{DIF}}$ (not shown) for diffraction from the lateral center of the said hologram layers, can be adjusted for height differences of the hologram layers shown, by way of example, as $\theta_{1B''_{DIF}}$ for hologram layer 1" in FIG. 8. Again, the said adjustment for the grouping of layers in a stack can be adjusted as described above (see FIG. 5) to compensate for holograms in the said stack having different distances along the vertical z-direction with respect to the plane of photovoltaic cell(s) 10 so as to provide for more optimal overlap of the said diffracted light that is transmitted from the hologram layers to photovoltaic cell(s) 10. Additionally, as described above, the said common diffraction exit angles, $\theta_{1A_{DIF}}$ and $\theta_{1B_{DIF}}$ for diffraction from the said edges and $\theta_{1_{DIF}}$ for diffraction from the lateral center of the said hologram layers, can exhibit angular dispersion, preferably less than about +/−30 degrees and more preferably less than about +/−22.5 degrees, for the reconstructed wavelength bandwidth with respect to the said center diffracted wavelength that exits the said hologram layers due to the aforementioned wavelength dispersion of the diffracted light that exits said volume holograms. By way of example, the lateral dimension values of 1$a$ can be 6" for lateral dimension of the said photovoltaic cell 10 and also for the said planar holograms 1" and 1, $\theta_{1A_{DIF}}$ and $\theta_{1B_{DIF}}$ can be 45.00°, and $z_{21}$=6" for vertical distance between a bottom planar hologram 1 in a stack and photovoltaic cell 10, and $z_{21''}$=6.20" for vertical distance between a top planar hologram 1" in a stack and the photovoltaic cell 10, then $\theta_{1A''_{DIF}}$ (not shown) and $\theta_{1B''_{DIF}}$=44.06° for more optimal overlap of wavelength bandwidth in the diffracted light that exits from the edges of holograms 1" and 1 and is incident at the edges of photovoltaic cell 10 and, additionally, for the center wavelength in the diffracted light that exits from the center of the holograms 1" and 1 and is incident at the center of photovoltaic cell 10.

In a preferred embodiment of the present invention, the diffracted light that exits the planar volume hologram layers in a grouping can have converging power so as to redirect a larger wavelength bandwidth of the incident substantially collimated sunlight to be incident onto the photovoltaic cell(s) 10. The common angle direction of the diffracted light having converging optical power and exiting from the volume holograms can be the angle of the optical axis of the diffracted light that exits the grouping of layers of volume holograms so as to converge, partially or fully, and thereby be incident on the photovoltaic cell(s) 10. For example, the wavefront of the diffracted light that exits the said planar volume holograms from incident sunlight that is substantially collimated can have converging optical power, such as from volume holograms recorded with an Object beam having converging optical power by use of at least one lens or a mirror having curvature. The method of recording the said planar volume holograms in the present invention so the diffracted lighted light exiting the volume holograms has converging optical power can include use of at least one spherical lens or cylindrical lens, or at least one aspherical lens or cylindrical lens, or at least one spherical or aspherical curved reflective surface such as a concave mirror or parabolic reflector or toroidal reflector, or combinations thereof, to impart suitable optical converging power to the recording Object beam. The recording Reference beam can, by way of example, be substantially collimated similar to the degree of collimation of sunlight that is incident to the said volume holograms disposed in solar concentrator system 100 or solar module 200. When the diffracted light exiting from said volume holograms acts as a lens and has converging optical power then the lateral displacement of the wavelength dispersion (see FIG. 3b for example of wavelength bandwidth) in the diffracted light exiting the said planar hologram layers 1", 1' and 1 can be reduced to provide for more optimal aiming of the reconstructed wavelength bandwidth of the incident sunlight in the said diffracted light that exits the said volume holograms, thereby providing for aiming a larger wavelength range of the reconstructed diffracted wavelength bandwidth to be incident onto the photovoltaic cell(s) 10. By way of example, in FIG. 5b diffracted light exiting from the said planar hologram layers 1' and 1 bounded by rays 25'a and 25'b and 25a and 25b, respectively, is shown schematically to have optical converging power with respect to optical axis 31, thereby reducing the lateral dimensions of the reconstructed wavelength bandwidth to provide for increasing the wavelength bandwidth in the diffracted light that is incident on photovoltaic cell 10 with respect to the lateral dimensions of the said photovoltaic cell 10. The said reduction in lateral dimension of the diffracted light aimed at the photovoltaic cell(s) 10 by way of converging optical power can advantageously provide for the said diffracted light exiting said planar holograms having larger wavelength dispersion (see FIG. 3b showing dispersion in reconstructed diffracted wavelengths for incident white light), at higher and/or lower angles with respect to the said optical axis angle 31, that can be redirected so as to be incident on photovoltaic cell(s) 10 rather than being displaced in x and/or y-directions outside the edges of photovoltaic cell 10.

The combined wavelength ranges for the light diffracted by hologram layers 1" and 1', and optionally for the light diffracted by said additional hologram layers in a grouping, for example layer 1, can preferably be a range across the full visible spectrum between about 400 nm and 700 nm and can optionally also include wavelengths in the near infrared region such as between about 700 nm and 1100 nm. The holograms layers contemplated can be designed to not diffract ultraviolet light or infrared light incident from the sunlight to the photovoltaic cells(s) 10, thereby reducing deleterious heating of the photovoltaic cells and providing for improved output efficiency from the photovoltaic cells 10. The diffracted light that exits from a grouping of at least two said hologram layers can comprise at least two wavelength ranges, $\lambda_1$ to $\lambda_2$ and $\lambda_3$ to $\lambda_4$, wherein the at least two wavelength ranges can be directed in common diffraction exit angles, $\theta_{1A_{DIF}}$ and $\theta_{1B_{DIF}}$ for diffraction from the said edges and $\theta_{1_{DIF}}$ (not shown) for diffraction from the lateral center of the said hologram layers, so as to be incident onto said photovoltaic cell(s) 10 at substantially the same location (i.e. superimposed), as shown in FIG. 8. As described above, the said common exit diffraction angles can be adjusted for the different hologram layers in the stack so as to compensate for holograms in the said stack having different distances along the vertical z-direction with respect to the top surface of the photovoltaic cell(s) 10. In this manner, the different wavelength ranges from sunlight in the visible spectrum, and optionally from wavelengths in the near infrared region, that are incident on the said volume hologram layers are diffracted by the said respective hologram layers in substantially common exit diffraction angles so as to be superimposed onto a photovoltaic cell(s) 10. In one embodiment, the distance between the said hologram layers and the photovoltaic cell(s) 10 along the diffraction direction is such that at least a portion of the diffracted light incident on the said solar cell(s) can generate white light on the photovoltaic cell by having coordinates on the CIE chromaticity plot corresponding to white light by the additive color theory.

By way of further example, referring to FIG. 7 as an example of a solar module of the present invention, rays 28b and 28c with respect to optical axis ray 28a, and/or rays 29b and 29c with respect to optical axis ray 29a, can represent the portion of the angular and wavelength bandwidth in the reconstructed diffracted light that exits the said volume holograms and is aimed with said converging optical power so as to be incident onto the lateral center of photovoltaic cell(s) 10. The diffracted light that exits the volume holograms and is aimed with converging optical power to the photovoltaic cell wherein the converging light can have a spherical or aspherical converging wavefront, and, by way of example, can alternatively have a cylindrical converging wavefront wherein the lateral center of the focused cylindrical converging wavefront can in one embodiment refer to a line or arc that extends along the y-direction across the lateral dimension of the photovoltaic cell(s) 10 such that the focused line intersects the center of the width of the photovoltaic cell(s) 10 along the x-axis direction. In the example case of cylindrical converging power, the diffracted light exiting the said volume holograms that is converging to be incident onto the photovoltaic cell(s) 10 can exhibit an ensemble of monochromatic or pseudo monochromatic lines or arcs that each can extend with a length across the lateral size of the photovoltaic cell(s) 10 along the y-direction, and wherein the width of the said monochromatic or pseudo monochromatic lines or arcs, referred to hereafter as monochromatic bands, in the diffracted wavelength bandwidth, can be on the order of 1 mm or less depending on the converging power of the diffracted light that exits said volume holograms. In this manner, sunlight of a certain wavelength incident over the entire area of a said planar volume hologram, such as over 36 square inches of a 6"×6" hologram or composite volume hologram, that exits the volume hologram or composite volume hologram can have a cylindrical converging wavefront and be focused to a line or arcuate path across the lateral size of the photovoltaic cell(s) 10 along the lateral y-direction, said focused monochromatic or pseudo monochromatic line of diffracted light having a narrow width such as about 1 to 2 mm or less. Other diffracted wavelengths in the reconstructed wavelength bandwidth from the incident sunlight that exits the said volume hologram, that are simultaneously collectively directed by the said volume hologram to be incident on the said photovoltaic cell(s) 10, can similarly each be collected from over the entire area of the said volume hologram to which the sunlight is incident and in the diffracted light that exits the said volume hologram each diffracted wavelength can be focused with a cylindrical converging wavefront to other corresponding monochromatic or pseudo monochromatic lines or arcs that extend in length across the lateral size of the photovoltaic cell(s) 10 along the lateral y-direction, each such line having a width on the order of about 1 to 2 mm or less. Preferably, the ensemble of the said monochromatic or pseudo monochromatic lines incident on the photovoltaic cell(s) 10 can illuminate the face area of the photovoltaic cell(s) 10 so as to be incident across its full lateral width and length dimensions, or across a portion of its full lateral width and length dimensions, as needed, but preferably not be incident outside its lateral dimensions. In another example embodiment, when the said layers of volume hologram are instead disposed so their grating planes are rotated 90° in the x-y plane compared to their orientation depicted in FIG. 7 with respect to the photovoltaic cell(s) 10, then the diffracted light exiting the said volume holograms that is focused with a cylindrical converging wavefront to be incident onto the photovoltaic cell(s) 10 can exhibit an ensemble of monochromatic lines or arcs that instead extend in length across the lateral size of the photovoltaic cell(s) 10 along the horizontal lateral x-direction, namely perpendicular to the direction when the grating planes are not rotated by 90 degrees. The concentration ratio for each of these monochromatic wavelengths, that are diffracted from the wavelength bandwidth of the incident sunlight that is incident over the area of the said volume hologram(s) to be incident on the said photovoltaic cell(s) 10, can therefore similarly be on the order of at least about 50 to 1, more preferably at least about 100 to 1, even more preferably at least about 200 to 1, still even more preferably at least about 300 to 1 for diffracted light that exits the example volume holograms and converges with faster focusing power. Further, the ensemble width dimension of the said grouping of monochromatic bands in the diffracted wavelength bandwidth that is directed by said volume holograms so as to be incident on the said photovoltaic cell(s) 10 can collectively illuminate the said photovoltaic cells(s) 10 across its full lateral width and length dimensions, or alternatively across a portion of its full lateral width and length dimensions, as needed.

Figure 9:
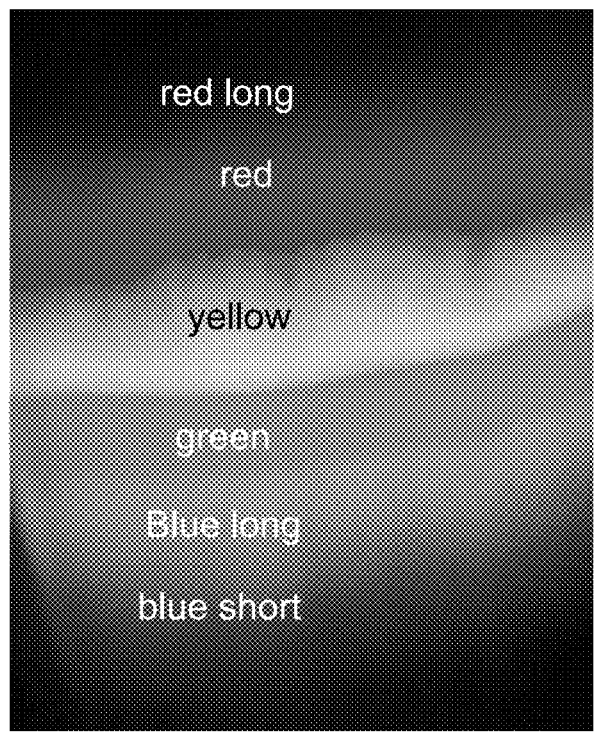
FIG. 9 is a photograph depicting the bands of color of the visible spectrum, formed on a photovoltaic material when incident white light is diffracted by a transmission volume hologram having cylindrical optical power.

By way of example, in FIG. 9 is shown example bands of color across the visible spectrum, each color band comprising groupings of focused arcs of said monochromatic or pseudo monochromatic color, in the diffracted wavelength bandwidth that exits an example transmission volume hologram and is directed with a cylindrical converging wavefront to focus onto the surface of an example polycrystalline Si photovoltaic cell 10 having dimensions 6"×6" and positioned at a distance of 6" behind and 6" shifted laterally with respect to the position of the said example volume hologram, wherein the surface of the said example Si photovoltaic cell 10 is covered with a thin white techwipe material to provide for easy viewing of the color bands that comprise groupings of the focused wavelengths incident onto the Si photovoltaic cell. The white light source for the example shown in FIG. 9 is a 4700° K halogen bulb that reasonably simulates the wavelength spectrum of incident sunlight. Further, the output of the halogen source is collimated with a mirror so as to be incident on the full area of the example volume hologram with a pseudo planar wavefront similar to the wavefront of incident sunlight. The exhibited dispersion of color bands, such as blue, green, yellow and red, diffracted by the said transmission volume hologram and focused onto the surface of the example Si cell, comprises the visible wavelength range between about 450 nm, at the near edge of the Si cell, and the low range of the Near Infrared (NIR) spectrum at 900 nm at the far edge of the Si photovoltaic cell. Each color band comprises a grouping of narrow monochromatic or pseudo monochromatic lines or arcs from the collimated light incident the hologram from the 4700° K white light source that illuminates the full area of the said volume hologram, wherein the said lines or arcs correspond to the diffracted wavelengths that exit the example transmission volume hologram and are directed with a cylindrical converging wavefront to focus onto the surface face of the Si photovoltaic cell, said transmission volume hologram recorded with a cylindrical converging wavefront from an example cylindrical lens. The grouping of said monochromatic or pseudo monochromatic arcs or lines within a color band, that extend across a lateral length direction, are distributed laterally across the width of the respective color band forming continuous color bands.

The example center wavelength of the wavelength bandwidth that exits the example transmission volume hologram and is directed to be focused onto the said Si photovoltaic cell, shown in FIG. 9, is at about 580 nm, corresponding to the yellow/green intersection of the color bands that is disposed at about the lateral center of the dimension of the Si photovoltaic cell. Optionally, the optical axis of the diffracted light that exits the said volume holograms can be directed to be focused onto the photovoltaic cell(s) 10 at a location that is not at the lateral center of the photovoltaic cell(s) 10, such as by use of an off axis optical design in the method and apparatus deployed for recording the said volume hologram(s). In one embodiment, the center wavelength of the wavelength bandwidth in the diffracted light that exits the volume hologram and is focused onto the said photovoltaic cell(s) 10, the said volume hologram(s) having been recorded in an interference pattern formed with at least one of the recording beam having optical power, can be different for the different layers of the volume hologram(s) in a said stack, wherein the respective center wavelengths can be designed to provide for the optimal total wavelength bandwidth that is diffracted to be incident onto the said cell(s) relative to the spectral sensitivity characteristics of the specific photovoltaic cell material. Further, the color bands incident onto the photovoltaic cell(s) 10 from the said volume hologram disposed laterally to one side of the photovoltaic cell(s) can be in the opposite color banding progression with respect to the color bands incident from said volume holograms disposed laterally to the other side of the photovoltaic cell(s). By way of example, a red color band incident from a said volume hologram disposed laterally to one side of the said photovoltaic cell(s) can be overlapping with a blue color band incident from a volume hologram disposed laterally to the other side of the photovoltaic cell(s). The specific grouping of color bands incident onto the photovoltaic cell(s) 10 can be different from the different layers of said volume holograms in a stack, therefore there can be a mixture of overlapping color bands incident onto the surface of the said photovoltaic cell(s) that can collectively be additive, similar to white light. The selection of overlapping color bands incident a location on the photovoltaic cell(s) 10, from the hologram(s) disposed to one side and from holograms disposed to the other side of the photovoltaic cell(s) 10, can be tuned to optimally match the spectral sensitivity characteristics of the photovoltaic cell(s) 10 material so as to enhance its output current or voltage.

Figure 10:
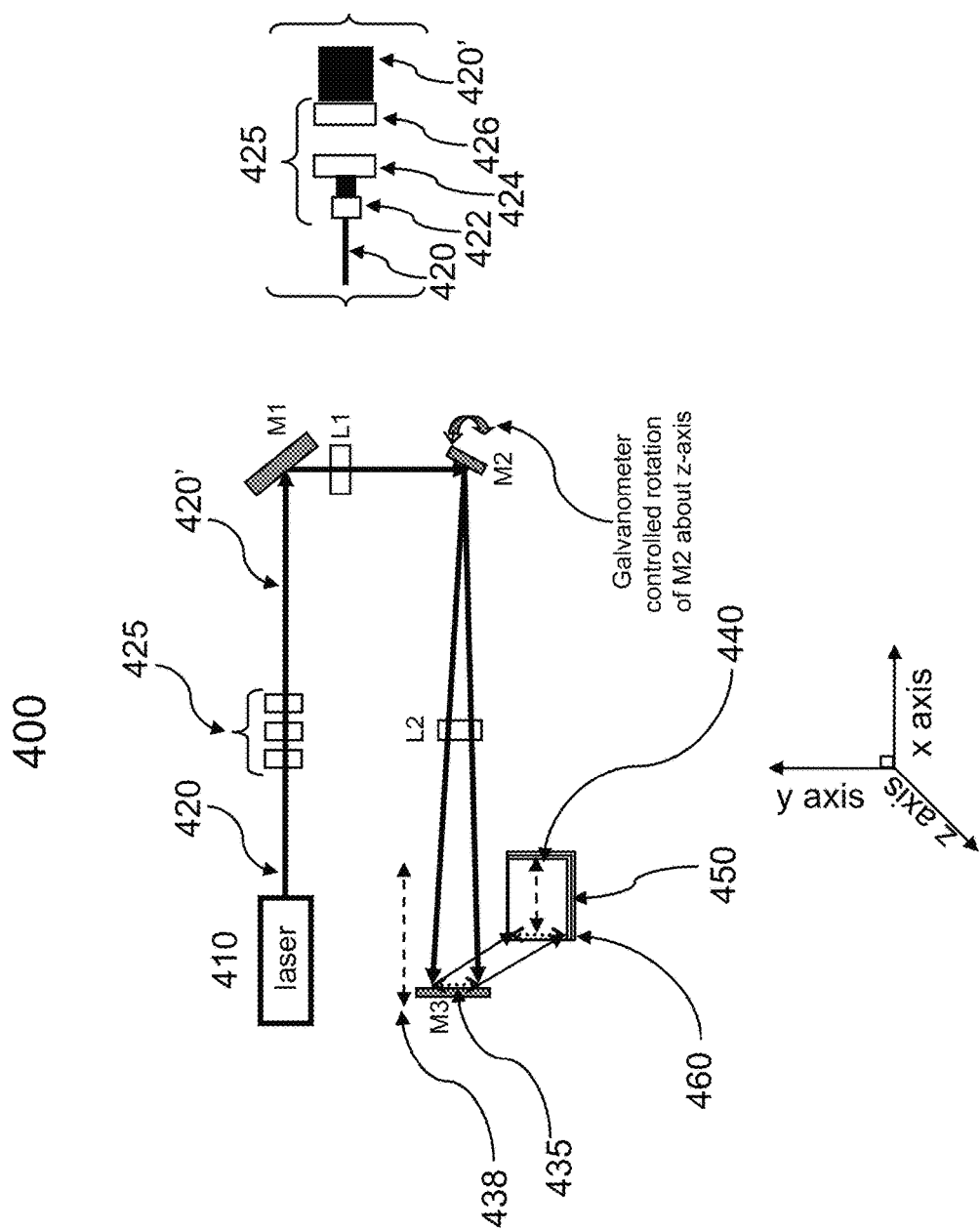
FIG. 10 is a schematic diagram of an example embodiment of an apparatus of the present invention useful for recording contact copy transmission holograms.

While converging optical power can be used in at least one of the recording beams to record the said volume holograms for the said solar concentrator system 100 or solar module 200 of the present invention, optionally, replication or copy holograms recorded from a master volume hologram or composite master volume hologram can be recorded using a contact copying method for the volume holograms of the present invention by using a single recording beam that can be collimated or pseudo collimated. An example contact copying method and apparatus 400, depicted schematically in FIG. 10, can be advantageous for rapid replication from a master hologram, due to the collimated laser beam used for the said copying method being, by way of example, a raw collimated laser beam 420 that can have considerably higher output power (watts/cm²) compared to the input power of recording beams that have a large expanded diameter in order to be suitable for recording the original or master hologram from which the copying is carried out. Further, the contact copying method for recording the holograms of the present invention can use a laser beam exiting directly from a laser that is reflected from a galvanometer controlled mirror, such as M2 depicted in FIG. 10, that can be rotatable about an axis such as the vertical axis (i.e. z-axis) to generate a flying spot laser beam, wherein the length of the resulting back and forth moving laser spot along a lateral distance, such as depicted by the dotted arrow 435 in FIG. 10 along the y-axis direction, which can be controlled by the oscillating rotation angle of the galvanometer controlled mirror, can be at least equal to the lateral dimension of the master hologram or composite master hologram being copied along the same y-axis direction. FIG. 10, by further example, depicts a takeoff mirror M1 that optionally can be disposed between the laser 410 and the galvanometer controlled mirror M2 thereby providing for beam folding along the optical path from the laser to M2.

Further, FIG. 10 depicts optional optical element(s) 425 that, by way of example, can be a polarizer, waveplate, lens, beam expander, or combinations thereof, positioned between the laser 410 and the galvanometer controlled mirror M2 as may be needed to modify the laser beam output 420 to a modified laser beam having a desired different polarization direction for recording the contact copy holograms, for example a preferred polarization direction in modified laser beam 420'. Additionally, optional optical element(s) 425 can be used to optimize overlap of the diffracted light that exits the master hologram 440 and the non diffracted light that exits the master hologram 440 that are each incident onto the copy recording media 450. By way of example, if the diffracted light from the master hologram or composite master hologram 440 is incident the copy recording material 450 at an angle, for example 45 degrees from the perpendicular to the copy recording material 450, and the non diffracted light is incident perpendicular to the copy recording material 450, wherein the master hologram or composite master hologram 440 comprises a substrate having thickness of at least about 1 mm, for example a glass substrate, then the non diffracted and diffracted light incident to the copy recording material 450 will be displaced laterally from each other and not be fully overlapping. The said lateral displacement between the diffracted and non diffracted light incident to the copy recording material will increase with the inclination angle of the said output diffracted beam with respect to the output non diffracted beam that exit the master hologram and are incident the copy recording material 450, and the range of inclination angles incident the copy recording material 450 for recording the contemplated copy hologram(s) of the present invention can be at least about 20 to 30 degrees. Accordingly, the diameter of the output 420 of laser 410 can be expanded in a lateral direction in a modified laser beam 420', for example along the y-axis direction, to provide for suitable overlap of the non diffracted and diffracted light that each exit the master hologram and is incident the copy recording material 450. In one embodiment, the output 420 of laser 410 can be expanded in a lateral direction and optionally collimated by use of optical element(s) 425 which can, by way of example, comprise a beam expander element 422, comprising 2 or more optical lens elements with different focal lengths, and further a first cylindrical lens element 424 and optionally a second cylindrical lens element 426, that can, by example, be spaced apart from lens element 424 by the sum of the focal lengths of lens elements 424 and 426, and, further, the lens elements 424 and 426 can be oriented with their respective cylindrical optical axis perpendicular to each other so as to provide for shaping the laser beam 420 into a modified laser beam 420' that can be collimated and have a beam profile with an elongated width, for example, in the shape of a rectangular bar extending with its length along the depicted y-axis direction and its height along the z-axis direction (see inset cross section view of bar extended laser beam 420'). By way of example, the height of the said laterally spread rectangular bar can be similar to or equal to the diameter of the expanded laser beam after it is expanded by beam expander element 422. For example, in FIG. 10, said beam expander and lens elements of optical element(s) 425 can be positioned between the laser 410 and the takeoff mirror M1 to provide for spreading the laser beam laterally and optionally collimating it, and further optionally changing the polarization direction for modified laser beam 420' that is incident on optional fold mirror M1. In one such embodiment, the rectangular bar shaped laser beam path 420' can be further passed through a lens of suitable diameter and focal length, for example, lens L1, optionally after being reflected from fold mirror M1, so as to be focused and imaged onto the galvanometer controlled mirror M2. In a further embodiment, the laser beam path reflected from the galvanometer controlled mirror M2, which can be a diverging laser beam path when the bar shaped laser beam path 420' is focused by lens L1 and imaged onto the galvanometer controlled mirror M2, L1 for example being a doublet lens, can optionally be collimated by one or more additional lens elements, such as depicted lens element L2, which, by way of example, can be a doublet lens that optionally can have a diameter which is at least equal to lateral dimension 435 of the oscillating back and forth moving laser spot and can be positioned between the galvanometer controlled mirror M2 and the master volume hologram 440. If the volume hologram being copied is a composite volume hologram, previously described, then the length of the back and forth moving laser spot 435, oscillating along the lateral dimension of 435 from oscillating rotation of galvanometer controlled mirror M2, can be equal to at least the lateral dimension of the sub holograms in the composite hologram, and, optionally, can be equal to at least the full lateral dimension of the said composite volume hologram.

By way of example, a takeoff mirror, such as M3 depicted in FIG. 10, can optionally be used to reflect the flying spot laser beam generated from a galvanometer controlled mirror M2 onto the master hologram 440 that preferably can be in optical contact with the copy media 450 disposed directly below, wherein the resulting diffracted and non diffracted light exiting from the said master volume hologram 440 can thereby be incident directly to the copy recording media 450. The takeoff mirror M3 can be a planar mirror, or optionally it can be a mirror having converging power so as to provide for collimating the light incident to M3 from M2, in which case M3 can be used together with additional lens element L2 to collimate the light reflected from M2, or, alternatively, M3 can be used instead of the additional lens element L2. The copy recording media 450 that is desirably in optical contact with a master hologram media 440 disposed above it can, additionally, in the case of copying a transmission master hologram, be in optical contact with a light absorbing material 460 that is disposed below the copy media 450. The light absorbing material 460, which is desirably in optical contact with the copy recording media 450 can, for example, be blackened glass such as welder's glass, or can be a glass color filter that substantially absorbs the wavelength of the flying spot laser beam, or other suitable material that absorbs the wavelength of the recording laser beam.

The said mirror used to reflect the said flying spot laser beam to the master hologram media, for example M3, can, additionally, be mounted to a movable translation stage that can be controlled to move the mirror M3 and thereby the reflected flying spot laser beam along a direction 438 perpendicular to the direction of the lateral length extent 435 of the flying spot laser beam, for example controlled to move M3 along the x-axis direction, thereby causing the back and forth movement of the flying spot laser beam along its length 435 to be additionally moved in a perpendicular direction 438 so as to be incident onto the master hologram and moved along the master hologram over its other lateral dimension depicted in FIG. 10 to be along the x-axis direction. For example, in FIG. 10 mirror M3 is mounted to a translation stage (not shown) element or apparatus, which can optionally be optically encoded such that its moveable position along the x-axis is controlled by a controller. The said translation stage can operate to move mirror M3 along the x-axis direction, shown as the dashed arrow direction 438, so as to move the position of the flying spot laser beam along the x-axis direction across the dimension of the master hologram media along the x-axis direction. This type of contact copying method can therefore operate so as move the position of the oscillating flying spot laser beam and thereby illuminate the entire area of the master hologram with a flying spot laser beam during a suitable scan. Alternatively, the copy recording media 450 can move under a master hologram media 440 disposed above it, for example, the copy recording media 450 can be a roll of copy recording media that can be unwound so it can be moved under a master hologram media, and further at least a section of the roll of the copying recording media can preferably be in optical contact with the master hologram media during the contact copying. The said roll of copy recording media can be moved in a continuous manner during the contact copying, or it can be moved in a stop and go manner wherein at least a section of the roll of copy media that is directly under the master hologram media is not moving when the diffracted and undiffracted light that exits the master hologram media is incident to the at least a section of the copy media for recording in the copy media.

The master volume hologram can be recorded such that an optimal ratio of diffracted and non diffracted light exits the master hologram and is thereby incident to the copy media that preferably is disposed to be in optical contact with the master hologram, so as to provide for efficient copying of the master hologram in the copy media. The ratios of diffracted and non diffracted light exiting the master volume hologram can be further adjusted, such as from the Bragg matching condition for highest diffraction efficiency of the master volume hologram, by tilting the said master hologram with respect to the incident collimated flying laser spot or bar thereby providing for an insitu adjustment of diffraction efficiency, such as when the intensity of the diffracted light that exits the master hologram is too large with respect to the intensity of the non diffracted light that exits the master hologram, so as to achieve recording of copy holograms with suitably high diffraction efficiency. Alternatively, a takeoff mirror such as M3 in FIG. 10 can be optionally mounted to a rotation stage (not shown) that can operate to rotate the said mirror about an axis, such as the z-axis depicted in FIG. 10, so as to change the incident angle of the flying spot laser with respect to the perpendicular to the surface of the said master hologram. The optimal ratios of diffracted and non diffracted intensity can vary depending on various factors that can include, for example, the chemical composition of the copy media and/or the chemistry method for recording the copy hologram, or the recording intensity of the laser beam incident the master hologram, or the rate of translation of the moving mirror with respect to the surface of the master hologram, or if a roll of copy media the rate of movement of the roll, or the recording sensitivity of the copy media. Copying of the master hologram or master composite hologram can be recorded in a copy media in the region of overlap of the diffracted and non diffracted light that exits the master hologram or master composite hologram and is incident onto the copy media so as to form an interference pattern in the copy media.

In one embodiment of the present invention, achromatization of at least a portion of the diffracted light exiting the hologram layers so as to be incident on the photovoltaic cell(s) 10 can be achieved by a grouping of said hologram layers that diffract the incident sunlight in respective wavelength ranges such as for the blue, green and red portions of the visible spectrum. For example, the first said hologram layer can diffract blue light from incident sunlight, said blue light having wavelengths centered at about 460 nm, a second said hologram layer can diffract green light from incident sunlight, said green light having wavelengths centered at about 560 nm, and a third said hologram layer can diffract red light from incident sunlight, said red light having wavelengths centered at about 660 nm, each said range of diffracted wavelengths exiting the grouping of holograms at a common diffraction exit angle such that the blue, green and red wavelengths incident onto the photovoltaic cell(s) 10 can be superimposed. Further, the combined wavelength ranges for the light diffracted by hologram layers 1" and 1', and optionally for the light diffracted by said additional hologram layers, for example layer 1 can preferably include wavelength ranges from both the visible and near infrared portions of the incident sunlight radiation. Additionally, in another embodiment the wavelength ranges of the incident sunlight radiation corresponding to the infrared and ultraviolet wavelengths can preferably not be diffracted by the said hologram layers and thereby not be redirected and not be incident on the said photovoltaic cell(s) 10 from the hologram layers.

In a further embodiment of the current invention, the diffracted light exiting the at least two said hologram layers, for example layers 1 and 1' or layers 2 and 2' in a stack or grouping of volume hologram layers, said diffracted light, for example, directed to be incident on the said photovoltaic cell(s) 10 at common diffraction exit angles for the respective wavelength ranges diffracted by the said hologram layers, can transmit through a gap, for example the gap depicted by dashed vertical arrows 21 in FIGS. 4, 5, 7, and 8 between the said hologram layers and the said photovoltaic cell(s) 10. The gap 21 can be air, which can provide for lower cost and weight for a solar concentrator system 100 or solar module 200 of the present invention comprising groupings of photovoltaic cells 10 and groupings of planar volume holograms, by comparison to aforementioned waveguide methods that require use of solid substrate blocks extending between the holograms and the photovoltaic cell wherein the said substrate blocks must be thick for standard sizes (≥5"× 5") of photovoltaic cells such as the generally used polycrystalline or monocrystalline Si solar cells. For solar concentrator system 100 comprising photovoltaic cell(s) 10, wherein the width of the photovoltaic cell(s) 10 can be nominally about ≤3", such as for aforementioned thin film technologies or for smaller polycrystalline or monocrystalline Si cells, the said gap can optionally be a substrate block that is preferably in optical contact with both the abutting hologram layer and the said photovoltaic cell(s). In alternative embodiments of apparatus and/or method of the present invention further described below, the common diffraction exit angles for a grouping of planar volume hologram layers arranged in a stack of layers can be combined advantageously with waveguide methods utilizing a wedge substrate to achieve higher concentration ratios compared to standard known waveguide concentrator methods that use holograms. Optionally, the diffraction exit angles for the said grouping of planar holograms, when in combination with use of a wedge substrate, can be different for the different layers of planar volume holograms in the grouping of layers to prevent undesirable reconstruction by one volume hologram layer of light diffracted from another volume hologram layer in the said grouping, wherein the diffracted light exiting the hologram layers is additionally reflected in the wedge substrate or at the interface of the wedge substrate and air.

Further, the planar arrangement of the said hologram layers in the present invention can be oriented in parallel planar relationship with respect to the photovoltaic cell(s) 10, wherein the cross-section area of the incident sunlight illuminating the said hologram layers in the plane of the said hologram layers can be the same as the cross-section area of the diffracted light that exits the said hologram layers and is incident to the photovoltaic cell(s) 10. For example, in FIGS. 4, 5, 7 and 8 the width 20a in x-direction of the incident sunlight illuminating the said volume hologram layers is the same as the overall hologram dimension along the x-direction depicted as 1a or 2a, and further is the same dimension along the x-direction as the width of the photovoltaic cell(s) 10. For example, the solar module system 200 depicted in FIG. 7 comprises photovoltaic cell(s) 10 disposed in a co-planar orientation that is parallel to the plane of schematically shown said hologram layers 1 and 1' or 2 and 2' that are arranged in a stack or grouping of volume hologram layers. The cross-sectional area of the incident sunlight in the plane of the said hologram layers can therefore be substantially the same as the cross-sectional area of the diffracted light incident on the said photovoltaic cell(s) 10 in the plane of the photovoltaic cell(s) 10, namely $(20a)^2 = (1a)^2 = (2a)^2$ for equal dimensions in x-direction and y-directions. In this arrangement there can be 1:1 area mapping of the cross-sectional area of the incident sunlight in the plane of the said grouping of hologram layers and the cross-sectional area of the respective diffracted sunlight incident the plane of the said photovoltaic cell(s) 10. In this embodiment of the present invention the number of groupings of said volume hologram layers in solar concentrator system 100 or solar module 200, wherein solar concentrator system 100 can be a subsystem of module 200, that direct diffracted light to photovoltaic cell(s) 10 determines the concentration factor, namely the number of equivalent suns for the sunlight that is directed so as to be incident on the photovoltaic cell(s) 10. Further, as described above, while the cross-sectional area of the said grouping of planar volume holograms can be the same as the cross-sectional area of the said photovoltaic cell(s) 10, optionally, in an apparatus or method of the current invention the cross-sectional area of the diffracted light incident on said photovoltaic cell(s) 10 in the plane of the photovoltaic cell(s) 10 can be smaller than the cross-sectional area of the photovoltaic cell(s) 10, such as by way of the diffracted light exiting the said grouping of planar holograms having converging optical power with respect to the said optical axis of the angular bandwidth of the diffraction exit angles comprising the wavelength bandwidth in the diffracted light that is aimed to be incident on the photovoltaic cell(s) 10.

Figure 11:
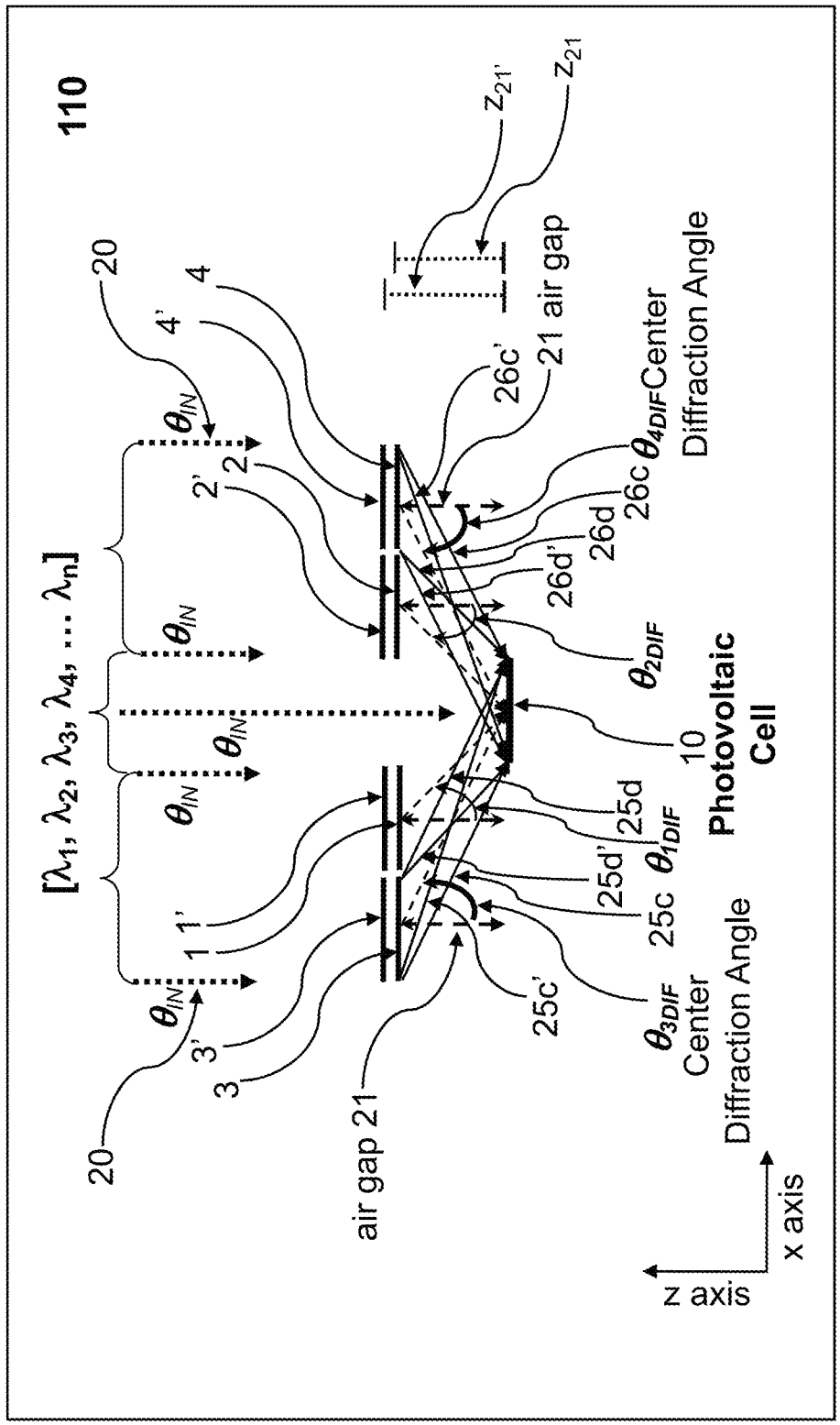
FIG. 11 is a schematic diagram of an example embodiment of the present invention.

By way of example, as shown in FIGS. 4 and 7, two groupings of said planar volume hologram layers, depicted as 1 and 1' and 2 and 2', each directing their center diffraction exit angles referred to generally as $\theta_{1_{DIF}}$ and $\theta_{2_{DIF}}$ degrees, respectively, from their lateral center (for example rays 28a or 29a) or outermost edge (for example rays 28b or 29b) or innermost edge (for example rays 28c or 29c) to be incident on photovoltaic cell 10 at substantially the same location corresponds to an example 3/1 concentration factor as the sunlight is additionally directly incident to photovoltaic cell 10. The groupings of said planar hologram layers can be arranged so as to be extended along rows (or columns), such as along the y-direction in FIG. 7, wherein there can be one said row (or column) disposed laterally on either side of the row (or column) of photovoltaic cells 10, thereby providing for 3/1 concentration factor. Alternatively, in another embodiment there can be 2 such rows (or columns) of groupings of planar hologram layers arranged so as to be disposed to the left and to the right of each row (or column) of photovoltaic cells 10, wherein the two said rows (or columns) disposed to either side can each direct incident sunlight to the row (or column) of photovoltaic cells 10 centered laterally between the said rows (or columns) of hologram layers disposed to the left and right, thereby providing for an example 5/1 concentration factor. By way of example, shown in FIG. 11 is a subsystem solar concentration system 110 of the present invention for an example of two rows of groupings of planar holograms, 1 and 1' and 3 and 3', disposed laterally to the left of photovoltaic cell 10 and two rows of grouping of planar holograms, 2 and 2' and 4 and 4', disposed laterally to the right of photovoltaic cell 10, wherein the said grouping of holograms for each of the said rows can be overlapping the same area, for example grouping 1 and 1' can be overlapping the same area or grouping 3 and 3' can independently be overlapping the same area. The center exit angles of the diffracted light shown in dashed arrows from the groupings of said planar volume holograms, 1 and 1' and grouping 3 and 3' and from 2 and 2' and grouping 4 and 4', each grouping disposed in parallel planes, will again be referred to generally in the foregoing descriptions of the present invention as $\theta_{1_{DIF}}$ and $\theta_{2_{DIF}}$, respectively, for grouping 1 and 1' and grouping 2 and 2' and as $\theta_{3_{DIF}}$ and $\theta_{4_{DIF}}$, respectively, for grouping 3 and 3' and grouping 4 and 4', with respect to the perpendicular to photovoltaic cells(s) 10, wherein the diffracted light exiting at said angles can be incident together or collectively on the photovoltaic cell(s) 10 such as at its lateral center. The diffracted light 25 exiting the edges of said hologram layers 1' and 1 so as to be incident on photovoltaic cell(s) 10 is depicted in FIG. 4 as solid arrows bounded by rays 25a and 25a' and rays 25b and 25b' and, similarly, the diffracted light 25 exiting the edges of said hologram layers 3' and 3 so as to be incident on photovoltaic cell(s) 10 is depicted in FIG. 11 as solid arrows bounded by rays 25c and 25c' and rays 25d and 25d'. The diffracted light 26 exiting the edges of said hologram layers 2' and 2 so as to be incident on photovoltaic cell(s) 10 is depicted in FIG. 4 as solid arrows bounded by rays 26a and 26a' and rays 26b and 26b' and, similarly, the diffracted light 26 exiting said hologram layers 4' and 4 so as to be incident photovoltaic cell(s) 10 is depicted in FIG. 11 as solid arrows bounded by rays 26c and 26c' and rays 26d and 26d'.

As previously described, the range of wavelengths, $\lambda_1, \lambda_2, \lambda_3, \lambda_4, \ldots \lambda_n$, of the incident sunlight 20 can be groupings of wavelengths in the visible spectrum, such as between about 400 nm and 700 nm so as to preferably generate the color components of white light that can be diffracted and thereby redirected and aimed to be incident onto the photovoltaic cell(s) 10, and, additionally, can be groupings of wavelengths in the near infrared spectrum, such as between about 700 nm and 1100 nm that similarly can be diffracted and thereby redirected and aimed to be incident onto photovoltaic cell(s) 10. The diffracted light exiting hologram layers 1 and 1' and the layers 2 and 2' can be incident on photovoltaic cell(s) 10 at a same first angle but from opposite directions with respect to the perpendicular 21 such that size of $\theta_{1_{DIF}}=\theta_{2_{DIF}}$, and diffracted light exiting hologram layers 3 and 3' and the layers 4 and 4' can be incident on photovoltaic cell(s) 10 independently at a same but larger angle than $\theta_{1_{DIF}}$ or $\theta_{2_{DIF}}$ with respect to the perpendicular 21 such that they are incident at a second angle size that is equal, size $\theta_{3_{DIF}}=\theta_{4_{DIF}}$, but from opposite directions. By way of example, $\theta_{1_{DIF}}=\theta_{2_{DIF}}$ size can be about 45° and $\theta_{3_{DIF}}=\theta_{4_{DIF}}$ size can be about 63° with respect to the perpendicular 21. Other suitable combinations of exit diffraction angles can be implemented depending on the lateral dimensions of the groupings of planar volume holograms and the lateral dimensions of the photovoltaic cell(s), and/or the vertical distance between the said hologram layers and the photovoltaic cell(s). As described above, the angle of the diffracted light exiting the holograms in each grouping of hologram layers can be adjusted to compensate for height differences of the hologram layers with respect to the surface of photovoltaic cell(s) 10, or alternatively, and further optionally as described above, the diffracted light incident exiting the said holograms and incident on the surface of the photovoltaic cell(s) 10 can have converging optical power.

In alternative embodiments of the present invention the cross-section area of the diffracted sunlight in the plane of the said photovoltaic cell(s) can be larger or smaller than the cross-section area of the incident sunlight in the plane of the said hologram layers. For example, the said holograms in one or more layers of the solar concentrator system 100 or 110 can change the wavefront of the incident sunlight 20 that is substantially collimated to be diffracted light that exits said holograms and converges or focuses to a smaller cross-sectional area in the plane of the photovoltaic cell(s) 10. Diffracted light that is partially or fully focused to the plane of the photovoltaic cell(s) 10 can in one embodiment provide for use of photovoltaic cell(s) having smaller area than the area of the grouping of planar volume holograms, thereby achieving increased concentration of sunlight, and, further, can also compensate for shifts in the x or y lateral positions of the diffracted light due to changes in the incident angle of the sunlight on the said hologram layers such as due to seasonal change that covers a range of +/−23.5 degrees, or due to wavelength dispersion in the diffracted light or to height differences in the distances of the layers of planar holograms from photovoltaic cell(s). Further, optionally the area of the said holograms in one or more layers of the solar concentrator system 100 or 110, such as said hologram layers 1 and 1' or layers 2 and 2' or hologram layers 3 and 3' or layers 4 and 4', in the plane of the said hologram layers can be smaller than the area of the photovoltaic cell(s) 10 in the parallel plane of the photovoltaic cell(s). This can be advantageous for compensating for shifts in the x or y lateral positions of the diffracted light on the photovoltaic cell(s) 10 from the said hologram layers that can occur, for example, due to changes in the incident tilt angle of the sunlight on the said hologram layers or due to wavelength dispersion in the diffracted light or to height differences in the distances of the layers of planar holograms from photovoltaic cell(s). Although in this alternative embodiment, for each grouping of volume hologram layers, such as 1 and 1' or layers 2 and 2', the area mapping can be less than 1:1 for the area of the incident sunlight in the plane of the said hologram layers and the area of the respective diffracted sunlight in the parallel plane of the said photovoltaic cell(s), the number of groupings of said hologram layers directing diffracted light to a photovoltaic cell(s) 10 and the area ratio of said hologram(s) to photovoltaic cell(s) will determine the effective concentration factor for the sunlight incident on the photovoltaic cell(s). For example, if the area ratio is 0.8 and the number of said groupings is eight, then the effective concentration factor is 7.4 suns (i.e. [(8×0.8)+1)), whereas if the area ratio is 1.2 and the number of groupings is eight then effective concentration factor is 10.6 suns.

In another embodiment of the current invention the said planar hologram layers in a solar concentrator system 100 or 110 can be arranged in groupings so as to be disposed laterally in a plane or layer that is oriented parallel with a plane containing the photovoltaic cell(s), such as a plane or layer disposed above or below the photovoltaic cell(s), wherein the said groupings can be positioned or located to surround the four lateral edges or positions of the photovoltaic cell(s) 10. For example, the said planar volume hologram layers can be disposed in groupings so as to abut the lateral locations (in the x-y plane) of the four edges of said photovoltaic cell(s) while the hologram layers can be disposed in a plane that is vertically separated along the z-direction from the photovoltaic cell(s) and can be parallel to the plane containing the photovoltaic cell(s). By way of example, the lateral side dimensions of the photovoltaic cell(s) 10 can be substantially the same as the lateral side dimensions of the said holograms in the volume hologram layers, or alternatively and as described above the said lateral side dimensions can be different. In an apparatus of the present invention, when the said lateral side dimensions are substantially the same, as depicted schematically in FIGS. 4, 5, 7, 8 and 11, the said hologram layers in groupings can operate independently to simultaneously collect incident sunlight from a grouping of areas, each substantially the same as the area of the photovoltaic cell(s), wherein the said areas collectively can be a much larger area than the area of the photovoltaic cell(s). Further, the said hologram layers in groupings can diffract and thereby redirect the sunlight that is incident on the said collectively larger area so as to be aimed to be incident collectively onto the said photovoltaic cell(s) having collectively smaller area, thereby providing for concentration of the sunlight onto the photovoltaic cell(s) by the sum of the grouping of the 1:1 area mappings of the areas of the incident sunlight to the area of the photovoltaic cell(s). The degree of concentration of the incident sunlight onto the photovoltaic cell(s) by the said grouping of volume hologram layers can be determined by the ratio of the sum of the area of each of the said groupings of disposed hologram layers diffracting sunlight onto the photovoltaic cell(s) plus the area of the photovoltaic cell(s) with respect to the area of the photovoltaic cell(s). In an alternative embodiment of the concentration method and/or apparatus of the current invention, the area of each of the said volume hologram layers disposed in groupings to surround or abut the four lateral edges or positions of the photovoltaic cell(s) 10 is not the same as the area of the photovoltaic cell, for example, as previously described the area of each hologram grouping can be larger or smaller than the area of the photovoltaic cell.

In another embodiment the one or more planar volume hologram layers can alter the angle direction of the diffracted light from a layer disposed above, such as by diffraction, thereby providing for a different exit diffraction angle that can be incident on the photovoltaic cell. In one embodiment the different exit angle can, by way of example, be an angle that reduces the angle of incidence onto the photovoltaic cell(s) thereby reducing reflection losses from the photovoltaic cell(s).

Figure 12A:
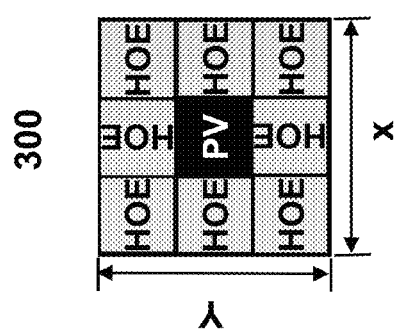
FIGS. 12a, 12b, and 12c each is a schematic diagram of example embodiment of the present invention.
Figure 12B:
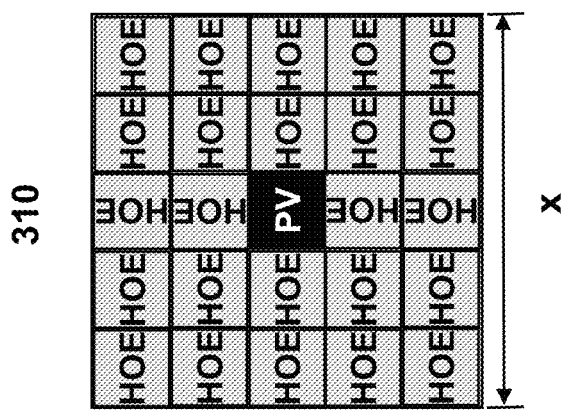
Figure 12C:
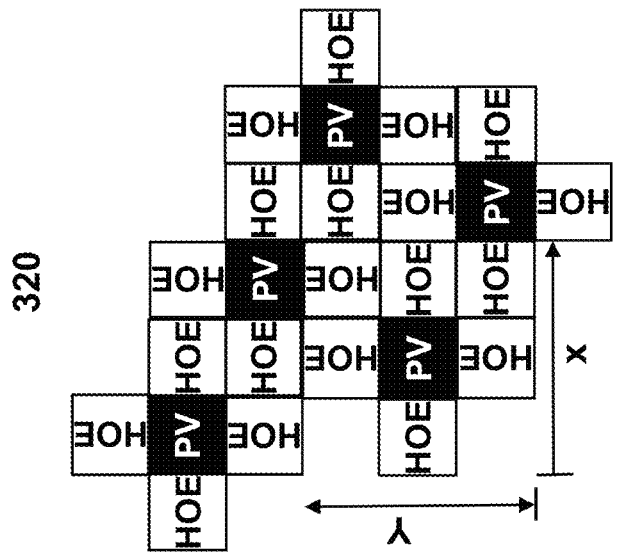

In a preferred embodiment of the present invention, the final output diffracted light that exits from the groupings of volume hologram layers so as to be incident collectively onto a photovoltaic cell(s) is directed with one common set of exit diffraction angles with respect to the perpendicular to a photovoltaic cell(s) so as to be incident collectively onto a photovoltaic cell(s) independent of the wavelength of the incident sunlight or the diffracted light to or from any one layer, notwithstanding any angle ranges about the said common set of diffraction angle directions due to wavelength dispersion of the diffracted light exiting from said volume hologram layers. The common set of exit diffraction angles from each grouping of hologram layers can be adjusted, as described above, for hologram layers within a grouping to compensate for different layers having different distances along the vertical direction from the photovoltaic cell(s). A grouping of said hologram layers can similarly be disposed laterally in a plane that is planar (parallel) with a photovoltaic cell(s), such as a plane disposed above or below the photovoltaic cell(s), wherein the said groupings can have sides that surround or abut the lateral locations in the x-y plane of the sides or edges of a photovoltaic cell(s), or alternatively, the hologram layers can be tilted with respect to the plane containing a photovoltaic cell(s). The degree of concentration of the incident sunlight onto a photovoltaic cell(s) by the said grouping of disposed hologram layers is similarly determined by the ratio of the sum of the areas of each said grouping of disposed hologram layers which collect and diffract the incident sunlight plus the area of the photovoltaic cell(s) that receives the said diffracted light with respect to the area of the photovoltaic cell(s) onto which the sunlight is redirected. Examples of concentration factors by the method and apparatus of the current invention can be 3/1 or 5/1 or 9/1 or 25/1 as shown schematically in FIG. 7 for 3/1, FIG. 11 for 5/1, and FIG. 12*a* for 9/1, FIG. 12*b* for 25/1, and 12*c* for 5/1 wherein the photovoltaic cell 10 in a concentrator subsystem 300 or 310 or 320 of a solar module of the present invention is labeled as PV and the grouping of hologram layers disposed about the photovoltaic cell 10 along the x-axis and/or y-axis directions, but are disposed in a plane along a z-axis direction that is above or below a plane containing the photovoltaic cell 10, are labeled as HOE. The photovoltaic cells labeled as PV are depicted in the x-y plane cross section view so as to be abutting the nearest neighbor HOE positions, whereas in the z-direction the said PVs are disposed by example to be below the plane of the HOE positions such as depicted with the x-axis and z-axis key at the bottom of FIG. 12. FIGS. 12*a* and 12*b* schematically depict an arrangement of PV and HOE elements that can be repeated as a subsystem solar concentrator system in a larger solar module. FIG. 12*c* depicts an alternative example for an arrangement of the HOE and PV locations, wherein an interlocking repeating mosaic pattern comprises groupings of four HOE elements disposed in a first x-y plane, each HOE element having one of its edges disposed in a side to side orientation with an edge of a PV element, each PV element disposed to be in a second x-y plane that is separated from the said first x-y plane along the z-direction, such that an edge of each of the four said HOE elements surrounding the lateral position of a PV element along the x and y directions in the cross sectional view abuts a lateral edge location of a PV in a x-y plane so as to be parallel to an edge of a PV element along the depicted x or y directions, thereby providing for an alternative embodiment having a 5/1 concentration factor without requiring larger incident angles such as would be the case for using a second row of hologram layers. The mosaic pattern can have added photovoltaic cells or grouping of holograms at the outer edges that do not complete the pattern but which provide for a straight outer edge. The dimension of the said solar concentrator subsystems 300, 310 and 320 along the x- and y-directions is shown schematically to be an integer multiple of dimensions of the photovoltaic cell, but other factors such as non integer values can also be used.

The vertical distance between the grouping of planar hologram layers disposed laterally with respect to the photovoltaic cell(s) 10 and the surface of the photovoltaic cell(s) 10 can be reduced to smaller distances along the z-axis direction, such as by reducing the lateral dimensions of the photovoltaic cell(s) 10 in the solar concentrator system 100 or 110 or solar module 200 or systems 300, 310 or 320.

By way of example, for a photovoltaic cell having 6" dimension along its x-direction and y-direction the said example concentrator subsystems 300 and 310 of the present invention can have overall dimensions of about 18" and 30", respectively, along the x-direction and y-directions, notwithstanding use of side frame structural members, providing for concentration factors of 9/1 and 25/1, respectively, based on the arrangement of photovoltaic cells and groupings of hologram layers. The said example concentrator subsystems 300 and 310 can be arranged so as to be repeated in abutting locations, for example, along the x- and y-directions so as to be arranged in a solar module of the present invention comprising a grouping of said concentrator subsystems. For example, said example concentrator subsystem 300 can be repeated along the length direction of a example solar module 501 two times, for example along an x-axis direction, and along the width direction once, for example along a y-axis direction, thereby forming a solar module 501 of the present invention that is about 54" in length and 36" in width comprising six concentrator subsystems 300, as shown schematically in FIG. 13*a*. The six concentrator subsystems 300 in example solar module 501 can each be oriented as depicted in FIG. 12*a* or can be rotated 90 degrees with respect to the orientation shown in FIG. 12*a*. The said example solar module 501 contains only six photovoltaic cells instead of fifty four (54) photovoltaic cells that are in a conventional type solar module that has output of 200 or more Watts. In a further example, said example concentrator subsystem 300 can comprise smaller photovoltaic cells, each for example having 4" dimension along its x and y-directions, and 300 can then be 12" along each of its x and y-directions, therefore it can be repeated along the length direction of an example solar module 502 of the present invention four times, such as along the x-axis direction, and along the width direction two times, such as along the y-axis direction, thereby forming an example solar module 502 that can be about 60" in length and 36" in width comprising fifteen concentrator subsystems 300 shown in FIG. 13*b*, wherein the said example solar module 502 contains fifteen smaller photovoltaic cells, each being 4"×4" dimension. The fifteen concentrator subsystems 300 in example solar module 502 can each be oriented as depicted in FIG. 12*a* or can be rotated 90 degrees with respect to the orientation shown in FIG. 12*a*.

Similarly, said example concentrator subsystem 310 comprising, for example, 6"×6" photovoltaic cells can be repeated along the length direction of a solar module 503 once, for example along the x-axis direction, and not along the width direction, thereby forming an example solar module 503 that is about 60" in length and 30" in width comprising two concentrator subsystems 310 shown in FIG. 13c, wherein the said module contains two photovoltaic cells instead of fifty photovoltaic cells of a conventional type solar module. In a still further example, said example concentrator subsystem 310 can comprise smaller photovoltaic cells, each, for example, having 4" dimension along its x and y-directions, and 310 can be 20" along each of those directions, therefore it can be repeated along the length direction twice and along the width direction once thereby forming an example solar module 504 that is about 60" in length, for example along the x-axis direction, and 40" in width, for example along the y-axis direction, comprising six concentrator subsystems 310, as shown in FIG. 13d, wherein the said module 504 contains six smaller 4"×4" photovoltaic cells, and can produce more output power than example module 503. The above described solar modules of the present invention are intended as representative examples comprising arrangements of example solar concentrator subsystems of the present invention, wherein the photovoltaic cells 10 are, by way of example, either a 4"×4" or 6"×6" lateral size and the groupings of planar holograms have, by way of example, lateral dimensions matching those of the photovoltaic cells, and wherein the vertical distance between the groupings of hologram layers and the photovoltaic cells in the concentrator subsystems can be the substantially the same as the lateral dimensions of the photovoltaic cells. The present invention additionally contemplates solar modules having other suitable arrangements of solar concentrator systems of the present invention that can have smaller or larger lateral dimensions for the photovoltaic cells 10 or for the groupings of planar volume hologram layers, and, further, wherein the said photovoltaic cells and planar volume hologram layers can have different lateral dimensions with respect to each other, and, still further, wherein the vertical distance between the groupings of planar volume hologram layers and the photovoltaic cells can be smaller or larger than the lateral dimensions of the photovoltaic cells as may be needed.

The holographic concentrator system of the present invention can advantageously use substantially 1:1 mapping of the area subtended by the incident illumination of sunlight on a grouping of hologram layers or stack of planar hologram layers, wherein the layers are preferably parallel within a said stack, with respect to the surface area of the photovoltaic cell that receives the diffracted light exiting from the respective hologram layer(s) in a said stack. In a preferred embodiment the photovoltaic cell is positioned in a parallel planar configuration at a different height position with respect to the volume hologram layers or stack of hologram layers that direct the sunlight to be incident to the photovoltaic cell. The hologram layers or stack of hologram layers in the concentrator system of the present invention can be positioned in repeating arrangements of rows (or columns) that diffract incident sunlight to photovoltaic cells also arranged in rows (or columns), such as configurations with one row (or column) of hologram layers disposed to either side of a row (or column) of photovoltaic cells (3 to 1 concentration) or 2 rows (or columns) of hologram layers disposed as a pair of rows (or columns) to either side of a row (or column) of photovoltaic cells (5 to 1 concentration), and the like. For a configuration with one or two rows (or columns) of hologram layers disposed to either side of a row (or column) of photovoltaic cells, the rows (or columns) of photovoltaic cells are disposed in a plane or panel that preferably can be positioned below the plane or panel of volume hologram rows for the case of transmission holograms, and disposed in a plane or panel above the plane or panel of hologram rows for reflection holograms. For a 3 to 1 or 5 to 1 row (or column) configuration, the set of the exit diffraction angles from a row of volume hologram layers or stack of volume hologram layers onto the respective row of photovoltaic cells is common from the grouping of hologram layers in a row of volume hologram layers to the respective photovoltaic cells disposed along the length of a said row of the row of hologram layers and photovoltaic cells so as to provide for directing the sunlight incident to the said row of hologram layers to be incident onto the corresponding row of photovoltaic cells. At the ends of the rows (or columns) of the photovoltaic cells there, additionally, can be one or more mirrors extending perpendicular to the plane of the said rows (or columns) of photovoltaic cells, wherein said mirrors can reflect diffracted light incident on the mirrors, from the diffracted light exiting the layers of holograms disposed at or near the end of the rows (or columns) of said hologram layers, downward to the photovoltaic cells disposed at or near the end of the rows (or columns) of said cells. The said example mirrors, by way of example, and without limitation, can have a height along the z-direction that is equal to or similar to the vertical separation distance between the bottom plane of the hologram layers and the surface of the photovoltaic cells and can operate so as to reflect diffracted light exiting from a row(s) (or column) of hologram layers downward to the surface of the solar cells. Said mirrors, for example, can be a planar mirror, or a mirror having facets on the surface, said facets having at least one angle for reflecting light downward to the row (or column) of solar cells, or the mirror can be curved so as to redirect the diffracted light incident thereon with optical power downward to the row (or column) of photovoltaic cells, and said mirror can comprise one or more smaller mirrors. For example, in system 200 in FIG. 7, a planar or curved or faceted mirror can be positioned at the respective ends of the rows (or columns) of the photovoltaic cells along the y-direction, such as in the y-z plane or alternatively tilted with respect to the y-z plane, wherein said mirror can, by example, have its width be the same as the lateral width of the row (or column) of the photovoltaic cells, or optionally the mirrors can be of different width, and the said mirrors can extend vertically along the z-direction.

With respect to the angle of the diffracted light exiting from a row of the said volume hologram layers to be incident to the respective row of photovoltaic cells, when the row of hologram layers are arranged to be in the example 5 to 1 configuration with the row of photovoltaic cells, then the said angle of diffracted light is larger from the $2^{nd}$ row of said hologram layers disposed to either side of the first row of hologram layers so as to be directed to the respective row of photovoltaic cells than for the angle of the diffracted light exiting from the 1st row of said holograms disposed to either side of the respective row of photovoltaic cells. The said row configuration can achieve a 1:1 area mapping between the area of the incident sunlight to the $1^{st}$ and $2^{nd}$ said rows of volume hologram layers and the diffracted light exiting the said $1^{st}$ and $2^{nd}$ rows of volume hologram layers and directed by the said row of hologram layers to be incident onto the row of photovoltaic cells. Alternatively, the groupings of hologram layers or stack of hologram layers can be positioned in grids as described above that, by way of example, can comprise groupings of volume hologram layers or stacks of volume hologram layers arranged in a 3×3 grid with the photovoltaic cell disposed at the lateral center of the grid along the x and y-directions (9 to 1 concentration in FIG. 12a) or 3×5 grids with the photovoltaic cell disposed at the lateral center of the grid along the x and y-directions (15 to 1 concentration) or 5×5 grids with the photovoltaic cell disposed at the lateral center of the grid along the x and y-directions (25 to 1 concentration in FIG. 12b), wherein said grids can be arranged so as to be repeated across a panel in a solar module along the x and y-directions. For a configuration with groupings of volume hologram layers or stacks of volume hologram layers arranged in said grids, the photovoltaic cell(s) can be disposed in a plane or panel positioned below the plane or panel of the grids of holograms for the case of transmission volume holograms, such as shown for solar modules 501, 502, 503 and 504, or located in a plane or panel positioned above the plane or panel of hologram grids for reflection volume holograms.

Figure 14A:
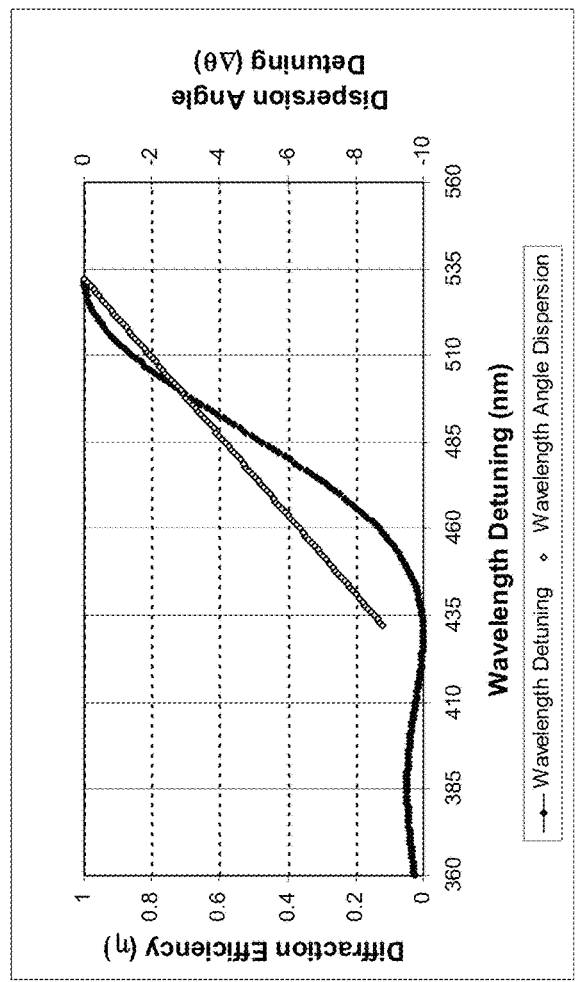
FIG. 14a is an example plot of wavelength dispersion to shorter wavelengths from the recording wavelength for a plane-wave volume transmission hologram.

In another embodiment of the current invention, the final output diffracted light that exits from the groupings of planar hologram layers can be directed in a set of common exit diffraction angles into a substrate material towards a bottom substrate/air interface of the substrate, said set of common exit diffraction angles from one hologram layer in a said grouping desirably independent of the wavelengths of the sunlight that is incident to another hologram layer in a said grouping or the wavelength of the diffracted light exiting from a layer in the said grouping, wherein the said set of common exit diffraction angles can comprise angles that are at least large enough to satisfy the condition for Total Internal Reflection (TIR) for the angle incident to the said bottom substrate/air interface. The set of common exit diffraction angles can be adjusted, as described above, for hologram layers within a grouping of volume hologram layers so as to compensate for different layers in a said grouping being different distances along the vertical direction from the said bottom substrate/air interface provided the exit diffraction angles for each said hologram layer within a grouping satisfies the condition for TIR for light incident on the said bottom substrate/air interface. Further, the angular dispersion for the wavelength bandwidth of the incident sunlight, $\Delta\lambda$, that is reconstructed by the said planar volume holograms in a grouping so as to be directed in the diffracted light that exits the holograms in a grouping to be incident to the bottom substrate/air interface, can include angles arising from wavelength dispersion of visible and/or NIR light in the diffracted light that occurs at shorter wavelengths than the reconstruction center wavelength, and thereby at smaller angles, such that the said small angles can reflect by TIR conditions from the said bottom substrate/air interface. Preferably, the wavelength dispersion occurring at shorter wavelengths than the reconstruction center wavelength can be reconstructed by the said volume holograms, then directed to the bottom substrate/air interface and then substantially reflected by TIR conditions at the bottom substrate/air interface. For example, shown in FIG. 14a is an example plot of wavelength dispersion to shorter wavelengths from the recording wavelength for a plane-wave volume transmission hologram, 10 μm thick, recorded at 532 nm with internal angles of 0° and 45°. The corresponding angle range for reconstruction of shorter wavelengths in the reconstructed wavelength bandwidth with respect to the center wavelength exhibits dispersion in accordance with the Bragg equation $2d \sin \theta/2 = n\lambda$ and is shown to be about 8 degrees. Therefore, in said example the reconstruction internal angles $\theta_{DIF_{int}}$ for shorter wavelengths in the reconstructed wavelength bandwidth that can be directed to be incident at the said bottom substrate surface/air interface can preferably be large enough angles to achieve TIR conditions for $\Delta\theta_{DIF_{int}} = -8°$ from the center angle. Alternatively, some portion of the shorter wavelengths in the reconstructed wavelength bandwidth may correspond to wavelengths for which the photovoltaic cell exhibits poor spectral sensitivity, and therefore such wavelengths can be directed to be incident to the said bottom substrate surface/air interface at angles that are smaller than the critical angle for TIR conditions and thereby transmit through the bottom substrate.

Figure 14B:
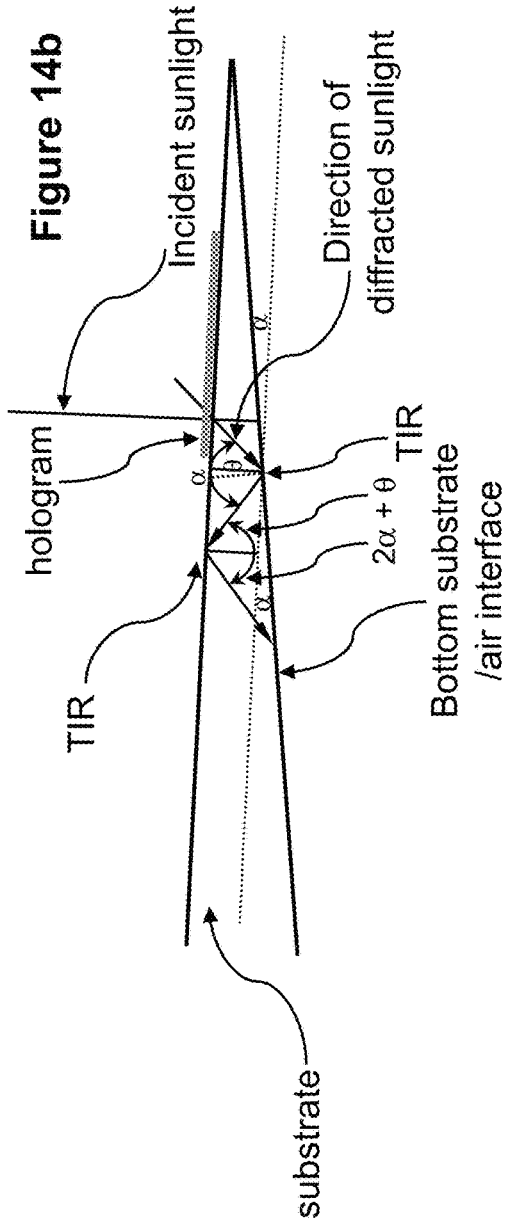
FIG. 14b is a schematic diagram of a TIR conditions achieved by a wedge substrate having a transmission hologram disposed thereon.
Figure 15:
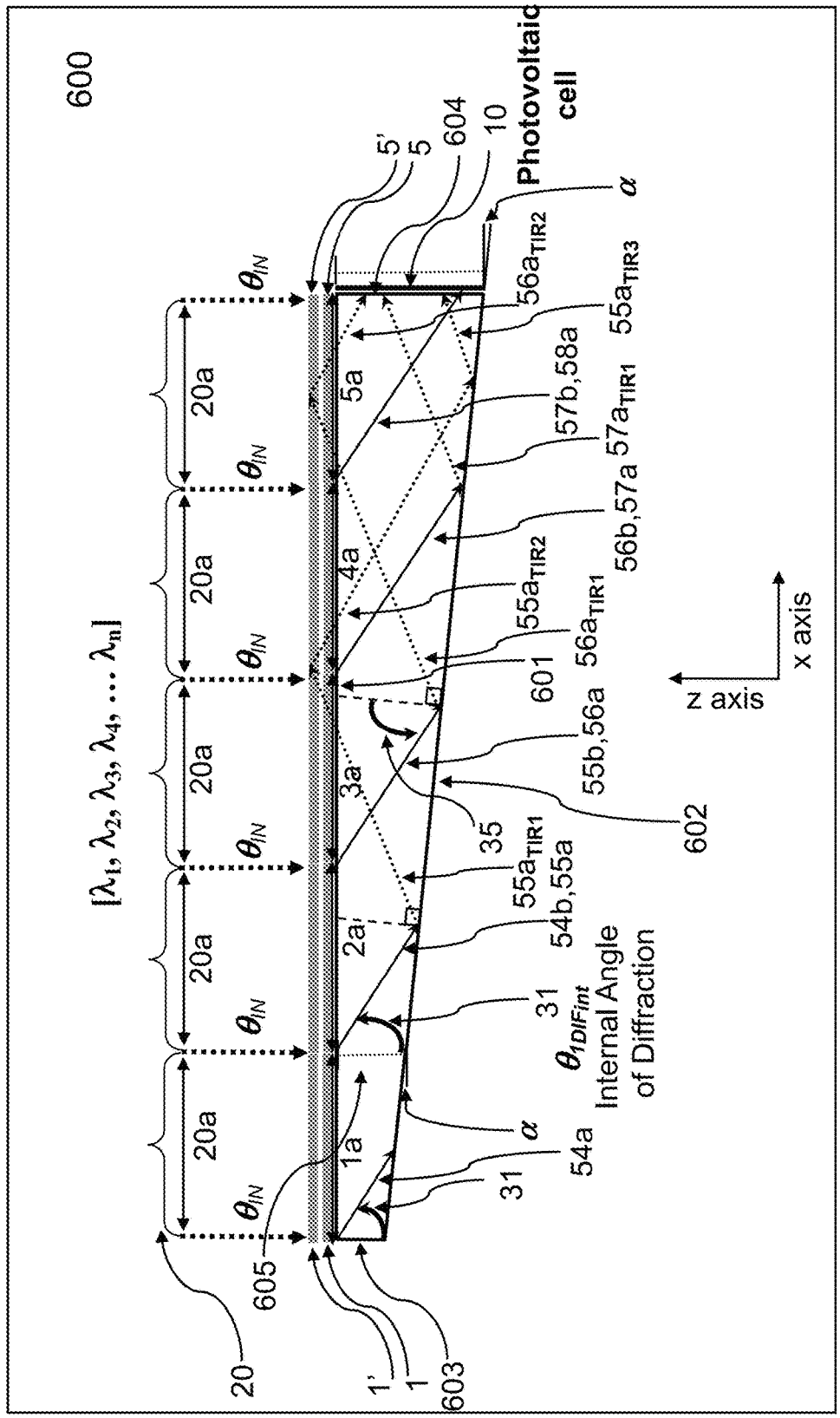
FIG. 15 is a schematic diagram of an example embodiment of the present invention.

By way of further example, the grouping of planar volume hologram layers can be disposed on a substrate, for example a wedge substrate, wherein there is a wedge angle α between the plane of the grouping of planar volume holograms and the bottom substrate/air interface of the wedge substrate as shown in FIG. 14b. The said wedge substrate in the present invention can have a bottom surface that is inclined at angle α with respect to the plane of the groupings of planar holograms, wherein the output diffracted light from the said volume holograms that reflects by a first total internal reflection from the bottom substrate/air interface of the wedge substrate can transmit back through a grouping of the planar holograms and can be reflected again at the top hologram/air interface at an angle incident on the top hologram/air interface that additionally can satisfy the condition for a second total internal reflection as shown in FIG. 15, described further below. The top hologram/air interface can, for example, be an interface of a hologram or a top layer substrate that encapsulates the top surface of the topmost hologram disposed in a grouping of planar holograms and air, wherein the material of a top layer substrate can be, by way of example, transparent glass or plastic or optically transparent crystalline material. In this manner at least a first total internal reflection occurring at the bottom substrate/air interface of the wedge substrate redirects the output diffracted light from the grouping of planar holograms disposed along the top of the wedge substrate via a second total internal reflection in a direction towards an edge of the said wedge substrate where, for example, a photovoltaic cell can be positioned in an abutting arrangement at a said edge, optionally preferably positioned to be in optical contact with an edge of the wedge substrate that extends in the vertical direction. Further, the said final output diffracted light from a grouping of said planar holograms positioned along the top of the wedge substrate near an edge of the said wedge substrate, said edge extending in the vertical direction, can be incident directly on the vertically extending edge of the said wedge substrate where the photovoltaic cell can be positioned, said photovoltaic cell optionally in optical contact with the said edge. The ratio of the length of the wedge substrate to the lateral dimension of the solar cell that is disposed along the vertical direction of the wedge substrate can determine the concentration ratio, which can be on the order of at least about 10/1 depending on the thickness of the planar holograms, their related Bragg angle selectivity and wavelength selectivity, and on the corresponding suitable value of α for achieving TIR without the TIR reflected light being diffracted by the volume hologram layers on passes back through the hologram layers from the top substrate/air interface. The extent of the reconstruction wavelength bandwidth, such as shown in FIG. 14a, should preferably be considered when determining the appropriate value for the wedge substrate angle α to overcome the range of reconstruction angles for the wavelengths that are longer and shorter than the center reconstruction wavelength of the said volume holograms and which otherwise can cause undesirable reconstruction of the TIR light (for example see FIG. 14a) on passing back through a volume hologram layer. Additionally, the reconstruction angles for the grouping of planar volume holograms can be different for the volume holograms that diffract different regions of the visible and NIR spectrum, so as to achieve the highest concentration ratio and compensate for reconstruction wavelength bandwidth provided the said angles can satisfy TIR conditions.

In FIG. 15 is shown in x-z plane cross sectional view an example concentration system 600 of the present invention comprising groupings of planar volume hologram layers disposed, by way of example, on the top surface of a wedge substrate 605, wherein said system 600 can be arranged in groupings that, for example, can be repeated at least once along the lateral x and/or y-dimensions of a solar module of the present invention. The example wedge substrate 605 of concentrator system 600 has four surfaces of note, a top surface 601, a bottom surface 602, a thinner edge 603 at one end of the length of the wedge substrate and a thicker edge 604 at the other end of the length of the wedge substrate. Such wedge substrates are, by way of example, found in liquid crystal displays, such as used for laptop computers, for purposes of redirecting light from the black plane compact fluorescent tube light source or light emitting diode light source upwards to the liquid crystal domains of the display. The wedge angle $\alpha$ between the said top and bottom surfaces of the wedge prism 605 can preferably be at least ½ the value of the Full Width Half Maximum (FWHM) of the Bragg selectivity profile for the thickness of the volume holograms in the grouping of planar volume holograms. For example, FWHM of the angular Bragg selectivity for a slant fringe hologram having thickness of 10 μm recorded with Object and Reference beams at internal angles of 0 and 45 degrees, respectively, is about 3.2 degrees, therefore a can, by way of example, be at least about 1.6 degrees for the grouping of planar holograms having FHWM=3.2 degrees, but, additionally, can preferably be larger so as to accommodate for the aforementioned angle range related to the reconstructed wavelength bandwidth in the diffracted light that exits the said volume holograms. The grouping of planar volume hologram layers disposed on the top surface of the wedge substrate 605 in concentrator system 600 can be arranged as abutting co-planar groupings, such as depicted schematically in FIG. 15 as volume hologram groupings 1' and 1, 2' and 2, 3' and 3, 4' and 4, and 5 and 5', respectively, wherein, by way of example, the length of the said groupings of volume holograms along the x-direction can be the same, namely 1a=2a=3a=4a=5a and the width (not shown in the cross section view) of the said grouping of volume holograms along the y-direction can, by way of example, also be the same. Alternatively, the grouping of planar volume hologram layers can extend along the entire length and width of top surface 601 in concentration system 600 or in any other suitable arrangement along the x and y dimensions of the top surface 601, and further can optionally extend along some or all of the x and y dimensions of at least one other abutting top surface 601 of another wedge substrate 605 that can optionally be in at least one other concentration system 600 that is part of a larger system. Alternatively, the groupings of planar volume holograms disposed along the said top surface of a wedge substrate, for example in abutting co-planar groupings, can have different lateral dimensions with respect to each other.

The final output diffracted light from a grouping of planar holograms can satisfy TIR conditions in accordance with Eqn. 1 for the angle incident to the bottom substrate/air interface of the wedge substrate. For example, in FIG. 15 output diffracted light at the Bragg angle matched reconstruction condition for the center wavelength exiting from planar holograms 2' and 2, shown as bounded by rays 55a and 55b, can be at internal angle 31 that can by way of example be $\theta_{1DIF_{int}}$=42 degrees with respect to the plane of holograms 2' and 2 and the top surface 601 of wedge substrate 605. The said output diffracted light is further shown to be incident at internal angle 35 with respect to the perpendicular to the bottom surface 602 of wedge substrate 605 thereby being, for example, $\theta_{1DIF_{int}}+\alpha=(42°\pm)$ degrees for TIR at said substrate/air interface having values of $n_1$=1.52 and $n_2$=1.0. The value of $\theta_{1DIF_{int}}$ can be increased to larger angles to accommodate for previously described wavelength bandwidth in the diffracted light that occurs for shorter wavelengths at lower angles than the recording wavelength and angles or center diffracted wavelength and angles, such as, for example, to about 48 degrees. The related TIR at the bottom wedge substrate/air interface 602, shown to be bounded by rays $55a_{TIR1}$ and $56a_{TIR1}$, achieves a second deviation of $\alpha$ degrees (see also FIG. 14b) for the once TIR reflected light that is incident to the grouping of planar holograms disposed to be parallel to the top surface wedge substrate surface 601, thereby providing for an incident angle of $\theta_{1DIF_{int}}+2\alpha$ for said once TIR redirected diffracted light incident at said grouping of planar volume holograms and top surface 601/air interface. By way of further example, wedge angle $\alpha$ can be at least 1.6 degrees and the once TIR reflected light bounded by rays $55a_{TIR1}$ and $56a_{TIR1}$ can be redirected by TIR from the bottom wedge substrate surface to be incident at 3.2 degrees to the said grouping of planar holograms disposed along the top wedge substrate surface, thereby transmitting through the said grouping of planar volume holograms having FWHM=3.2 degrees, said holograms disposed along the length of the wedge substrate further along the x-direction from the location of the grouping of holograms 2' and 2, without the center reconstruction wavelength being diffracted when transmitting back into the said volume holograms. When $\alpha$=FWHH/2, then the maximum concentration ratio achievable for the said example hologram of 10 μm thickness is 1/tan $\alpha$=1/tan (1.6°)=36× concentration ratio, wherein the minimum value of $\alpha$ is inversely dependent on thickness of the hologram. For the said example volume slant fringe hologram, $\alpha$ can preferably be larger, for example about 6°, so as to compensate for the angle deviation of the above described reconstruction wavelength bandwidth that can otherwise cause TIR light from diffracted light exiting from one volume hologram layer to be diffracted by another volume hologram layer in the groupings, wherein the concentration ratio at $\alpha$=6° can therefore be about 10/1 to a photovoltaic cell. If the photovoltaic cell 10 is a bifacial type, then the concentration ratio can be two times higher still by disposing two of said wedge substrate concentrator systems 600 in a back to back confronting arrangement, thereby each operating to redirect incident sunlight to one side of a bifacial photovoltaic material. The direction of the diffracted light exiting the planar volume holograms and the direction of the TIR light from the bottom substrate/air interface along the length direction of the said wedge substrate 605 can optionally be in the opposing direction to the rays depicted in FIG. 15.

The once TIR reflected light that is transmitted through the grouping of planar hologram layers can reflect again by TIR at the top hologram/air interface, for example of holograms 1', 2', 3', 4' or 5', to become twice TIR reflected light, wherein the TIR can continue with additional reflections, as needed, at the bottom substrate surface/air interface and top hologram/air interface so as to propagate in the example wedge substrate 605 along the x-axis direction to be incident on photovoltaic cell 10 that can be disposed at or near the thicker edge 604 of wedge substrate 605, said photovoltaic cell optionally in optical contact with the thicker edge 604 of wedge substrate 605. Optionally, the direction of the diffracted light exiting the planar volume holograms and the direction of the TIR light from the bottom substrate/air interface along the length direction of the said wedge substrate can be in the opposing direction to the rays depicted in FIG. 15 so as to be incident on the thinner edge 603. The diffracted light exiting in a set of common exit diffraction angles from a grouping of planar holograms layers disposed along the length of the example wedge substrate 605 and directed towards a bottom substrate/air interface of the substrate 605, can be incident directly on photovoltaic cell 10 disposed at or near the thicker edge 604 of wedge substrate 605, said photovoltaic cell optionally in optical contact with the thicker edge 604 of wedge substrate 605, or further optionally in optical contact with the thinner edge 603 of wedge substrate 605, or may be incident on said photovoltaic cell 10 after being at least once TIR reflected light. FIG. 15, by way of example, shows examples for diffracted light aimed to be directly incident on said photovoltaic cell 10 (diffracted ray 57b, 58a from hologram grouping 5' and 5), as well as being incident after once TIR reflected light (i.e. depicted by continuation of ray $57a_{TIR1}$), twice TIR reflected light (i.e. continuation of depicted ray $56a_{TIR1}$) and three times TIR reflected light (i.e. continuation of depicted ray $55a_{TIR1}$). Further, optionally, the said volume hologram layers can be recorded to diffract light at an angle that can be larger for a said layer that is to diffract the longer wavelengths incident from sunlight than for a layer in the grouping that is to diffract the shorter wavelengths, and accordingly the diffraction angle $\theta_{DIF_{int}}$ exiting from the different volume hologram layers into the wedge substrate 605, such as the angle for the center diffraction wavelength exiting from a said hologram layer, is optionally not a common angle.

A method and apparatus of the present invention comprising the wedge substrate, by way of propagating TIR reflected light incident, from diffracted light exiting a grouping of holograms disposed along said wedge substrate 605, towards said edge 604, optionally to edge 603, can advantageously provide for overlap of all the diffracted wavelengths, $\lambda_1, \lambda_2, \lambda_{3_2}, \lambda_4 \ldots \lambda_m$ of the incident sunlight 20 that is incident to said grouping of volume holograms and is diffracted by the planar volume hologram layers at the aforementioned common set of diffraction angles to be aimed at said edge of wedge substrate 605, provided a of the wedge substrate 605 is selected properly for the thickness of the holograms so as to provide for the TIR reflected light to be transmitted through the grouping of hologram layers to become TIR reflected light from the top hologram/air interface or from the top substrate(s) encapsulating the topmost hologram(s). Additionally, diffuse sunlight from white or grey sky conditions incident over $2\pi$ angular cone on the said groupings of planar hologram layers can substantially transmit through the said groupings of planar hologram layers and become incident at the bottom substrate surface/air interface 602, whereby, some of the transmitted diffuse light can be incident at angles that satisfy TIR condition at said bottom surface 602 and can propagate along said wedge substrate 605 towards said edge 604, optionally towards edge 603, wherein photovoltaic cell(s) 10 are disposed to be positioned at or near said edge surface of wedge substrate 605 and optionally are in optical contact with the said edge. In this manner the wedge substrate 605 can operate so as to redirect by TIR and confine both diffracted direct sunlight and non diffracted diffuse sunlight to be incident on photovoltaic cell(s) 10 that is oriented in a vertical direction with respect to the plane of the grouping of planar holograms. Further, the edges along the length of the example wedge substrate 605 can optionally be reflective surfaces such as mirrors that can reflect incident light by specular reflection so as to further confine diffuse light that undergoes TIR from bottom substrate/air interface and/or to further confine diffracted direct sunlight that can have off axis tilt from the design reconstruction angle due to incident sunlight having an angle of incidence that changes such as due to seasonal changes or daytime changes. Additionally, non diffracted direct sunlight, such as undesirable UV radiation or infrared radiation, can advantageously transmit through the bottom substrate surface/air interface 602 and not be redirected by TIR towards the photovoltaic cell(s) 10, whereby the photovoltaic cell(s) can achieve increased efficiency.

Figure 16:
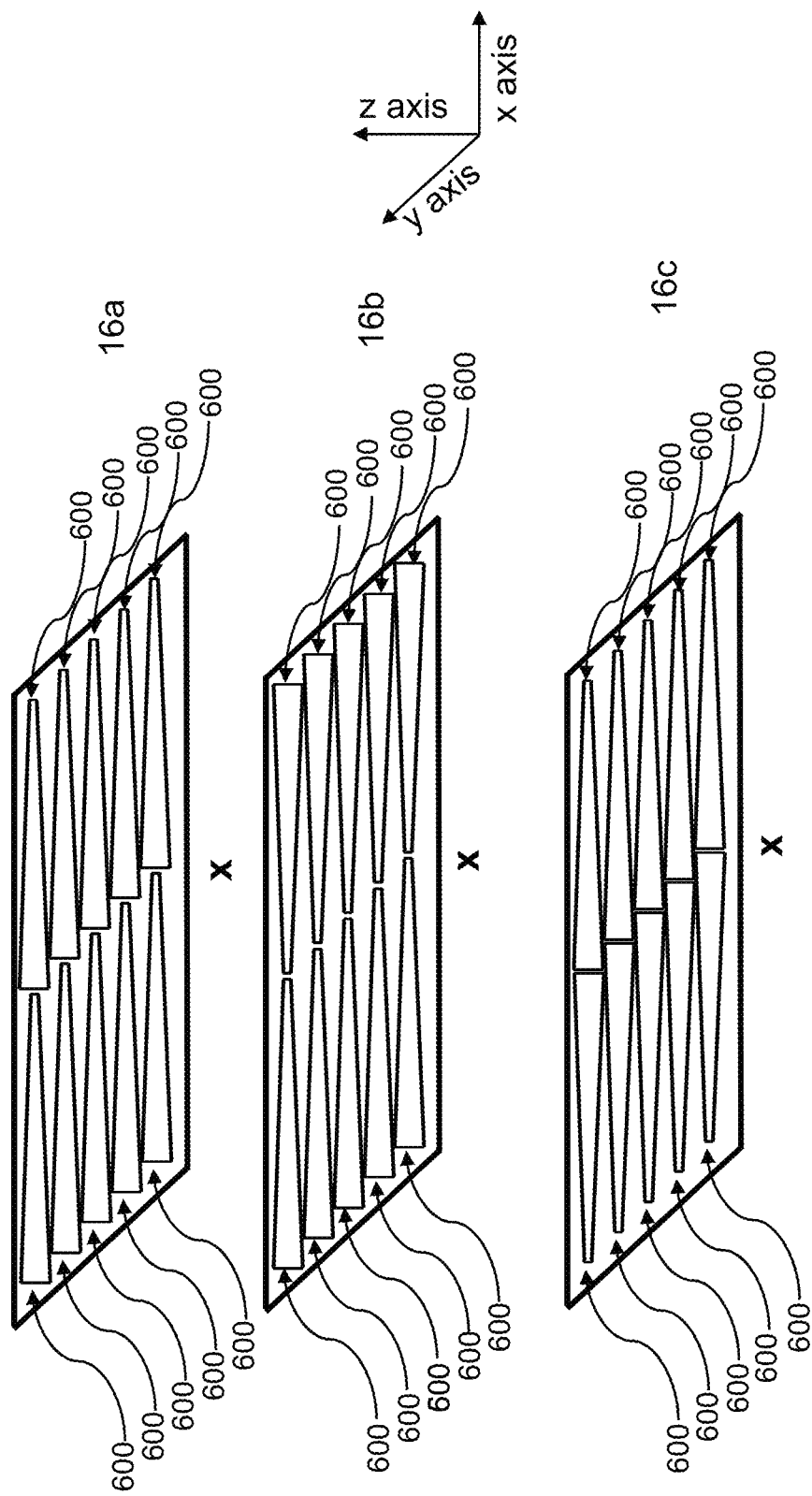
FIG. 16 is a schematic diagram of an example embodiment of the present invention.

Similarly to the configurations depicted in FIG. 13 for arrangements of concentrator subsystems 300 and 310 along the x and y-directions in solar modules 501 and 502, concentrator system 600 comprising at least one wedge substrate 605 and at least one grouping of planar holograms disposed on a surface of said wedge substrate 605 can be arranged as subsystems so as to be repeated along rows and/or columns such as along the x and y-directions. FIG. 16 depicts example arrangements of concentrator subsystem 600, each depicted in the x-z plane cross sectional view, that, by way of example, can be disposed in at least 2 columns, such as along the y-direction, and in at least 2 rows such as along the x-direction. Any number of columns and rows comprising at least one said concentrator subsystem 600 can be combined in groupings to cover the area of a solar module. Further, the grouping of subsystems 600 can be oriented to have the said thin edge of a wedge substrate 605 confronting the thick edge of another wedge substrate 605 (FIG. 16a), or the thin edge can be confronting the thin edge of another wedge substrate 605 (FIG. 16b), or the thick edge of a wedge substrate 605 can be confronting the thick edge of another wedge substrate 605 (FIG. 16c). Other suitable arrangements of groupings of concentrator subsystem 600 in a solar module are also contemplated by the present invention. In this manner an array of concentrator subsystems 600 can have an aggregate area that can be similar to the area of a solar module, thereby collecting incident sunlight from a large area that can be similar to the area of a solar module and concentrating the sunlight to a smaller area that is the area of a grouping of photovoltaic cells disposed on an edge of said wedge substrate(s) 605, wherein the photovoltaic cells 10 can be monofacial or bifacial type cells. In the case of bifacial type photovoltaic cells, two said wedge substrates 605 can be arranged as a pair in a confronting orientation so the thicker edges of the two wedge substrates (see FIG. 16c), optionally the thinner edges (FIG. 16b), can be abutting at the ends of the lengths of each of the two substrates and said edges can sandwich the said bifacial cell such that a face on each side of the bifacial cell is in optical contact with the thicker edge, optionally the thinner edge, of the pair of wedge substrates. The said at least one grouping of planar volume holograms can be arranged so as to be repeated to extend across or along the said wedge substrate 605 in the said concentrator subsystem 600, or can have a size that extends across or along at least one wedge substrate 605 positioned along the x and y-directions in the said concentrator subsystem 600, or can extend across or along at least one wedge substrate 605 positioned along the x and y-directions in at least one concentrator subsystem 600 that independently can be in arrangements that extend across the x and y-directions of a solar module. Mirrors or mirrored surfaces may be utilized along the lengthwise edges of the concentrator subsystem 600 arranged in a solar module so as to reflect diffracted and/or TIR light that is incident on the edges as described above.

The said concentrator systems and solar modules of the present invention can be aligned with respect to the incident angle of sunlight to adjust for changes in incident angle during the daytime or during seasonal changes, or combinations thereof, so as to maintain suitably high values for the reconstruction diffraction efficiency achieved by the volume holograms. The degree of alignment and accuracy of alignment can depend on various factors such as the thickness of the volume holograms, the slant angle of the grating planes for said volume holograms, and whether the grating planes of said volume holograms are disposed in-line or perpendicular with the direction of change of the incident angle of the sunlight. By way of example, thinner volume holograms or holograms having grating planes with larger slant angles can provide for coarser adjustment of the incident angle of sunlight during the daytime or seasonal changes of the sun's incident angle so as to maintain suitably high values for the reconstruction diffraction efficiency that exits the holograms and is directed to the photovoltaic cell(s). The groupings of planar volume holograms can further be aligned so as minimize the amount of alignment or the accuracy requirements for such alignment, such as by orientating the grating planes recorded in the volume holograms to be substantially in-line with the direction of change for the incident angle of the sunlight. Use of in-line orientation of the grating planes in the aforementioned concentrator systems of the present invention with respect to the incident sunlight can, for example, decrease the requirements for adjustment of incident angle with respect to the range of the incident angles of the sunlight by a factor of about 10, such as from +/−2 degrees to about +/−25 degrees. By way of further example, in this manner the alignment requirements for the concentrator systems or solar modules of the present invention can be considerably coarser with respect to the changing polar or azimuthal angles of the incident sunlight such that adjustment to maintain suitable alignment to maintain high values for the reconstruction diffraction efficiency that exits the holograms and is directed to the photovolataic cell(s) can preferably be about one rotational axis instead of two rotational axes.

The teachings of all patents, published applications and references cited herein are incorporated by reference in their entirety.]

While this invention has been particularly shown and described with references to example embodiments thereof, it will be understood by those skilled in the art that various changes in form and details may be made therein without departing from the scope of the invention encompassed by the appended claims.

What is claimed is:

1. An electromagnetic wave concentrating system, comprising:
    a photovoltaic material; and
    at least a first holographic concentrator, comprising:
        a first transmission holographic optical element (HOE) configured to diffract incident light into a first diffracted beam having a first range of wavelengths, and
        at least a second transmission HOE configured to diffract incident light into a second diffracted beam having a second range of wavelengths, different from the first range of wavelength, the first and the second diffracted beams directed to the photovoltaic material, wherein:
    the first diffracted beam is at least partially incident on and transmitted by the at least second HOE;
    wherein a portion of the incident light is directly incident to the photovoltaic material; and
    wherein the at least second transmission HOE and the photovoltaic material are separated by a space consisting of an air gap, and further wherein the first diffracted beam and the second diffracted beams each passes through the air gap to the photovoltaic material.

2. The concentrating system of claim 1, further including at least a third transmission HOE, configured to diffract incident light into a third diffracted beam having a third range of wavelengths, different from the first and the second ranges of wavelength, the second diffracted beam being at least partially incident on and transmitted by the at least the third transmission HOE.

3. The concentrating system of claim 1, wherein the first range and the second range, combined, include wavelengths from about 400 nm to about 900 nm.

4. The concentrating system of claim 3, wherein the first range and the second range, combined, include wavelengths from about 450 nm to about 850 nm.

5. The concentrating system of claim 2, wherein the first range, the second range, and the third range, combined, include wavelengths from about 400 nm to about 1300 nm.

6. The concentrating system of claim 5, wherein the first range, the second range, and the third range, combined, include wavelengths from about 450 nm to about 1150 nm.

7. The concentrating system of claim 1, wherein the first transmission HOE and the at least second transmission HOE are in optical contact.

8. The concentrating system of claim 1, wherein:
    the first transmission HOE and the at least second transmission HOE have a first and a second lateral sizes, respectively, the first and the second lateral sizes being the same; and
    the photovoltaic material has a lateral size, the lateral size of the photovoltaic material being equal to or greater than the first and the second lateral sizes.

9. The concentrating system of claim 8, wherein the first and the second diffracted beams each is diffracted at a center angle of about 45° and each impinges on the photovoltaic material.

10. The concentrating system of claim 1, wherein:
    the first transmission HOE is disposed in a first plane;
    the at least second transmission HOE is disposed in a second plane; and
    the photovoltaic material is disposed in a third plane, and further wherein the first plane, the second plane, and the third plane each is about parallel to one another.

11. The concentrating system of claim 1, wherein:
    the photovoltaic material is disposed in a plane;
    the first transmission HOE and the at least second transmission HOE each has optical power and are each disposed in a plane parallel to the plane of the photovoltaic material; and
    the first diffracted beam and the second diffracted beam each is focused into an arc or an area having a length on the photovoltaic material.

12. The concentrating system of claim 1, wherein the concentrating system further includes at least a second holographic concentrator spatially offset from the at least first holographic concentrator in a plane parallel to the plane of the photovoltaic material.

13. The concentrating system of claim 12, wherein the at least first and the at least second holographic concentrators are each disposed equidistantly and in opposite directions from a plane perpendicular to the plane of the photovoltaic material.

14. The concentration system of claim 1, wherein the first transmission HOE and the at least second transmission HOE each independently is a volume phase transmission hologram.

15. The concentrating system of claim 11, wherein the optical power is cylindrical.

16. The concentrating system of claim 12, wherein the photovoltaic material comprises at least one column or row of photovoltaic material elements, and the at least first and second holographic concentrators are disposed in an abutting relationship along a direction that is the length direction of the at least one column or row.

17. The concentrating system of claim 1, wherein the photovoltaic material is selected from polycrystalline Si, monocrystalline Si, Si film, single junction GaAs single crystal or thin film, CdTe, Cu(In,Ga)Se2, amorphous Si, or organic dye sensitized photovoltaic materials.

18. The concentrating system of claim 1, wherein the first transmission HOE and the at least the second transmission HOE are laminated together or attached or connected in a stack by an optically transparent adhesive selected from an adhesive initiated by actinic radiation, a thermally activated adhesive, and a pressure-sensitive adhesive.

19. The concentrating system of claim 1, wherein the first transmission HOE and the at least the second transmission HOE each comprises a grouping of abutting or tiled transmission holograms that are arranged in a grouping of at least 2 rows or at least 2 columns over the area of each of the first transmission HOE and the at least the second transmission HOE.

* * * * *